United States Patent [10] Patent No.: US 8,729,407 B2
Mori (45) Date of Patent: May 20, 2014

(54) WIRING SUBSTRATE AND METHOD FOR MANUFACTURING WIRING SUBSTRATE

(75) Inventor: Kenichi Mori, Nagano (JP)

(73) Assignee: Shinko ELectric Industries Co., Ltd., Nagano (JP)

(*) Notice: Subject to any disclaimer, the term of this patent is extended or adjusted under 35 U.S.C. 154(b) by 112 days.

(21) Appl. No.: 13/480,985

(22) Filed: May 25, 2012

(65) Prior Publication Data

US 2012/0298413 A1 Nov. 29, 2012

(30) Foreign Application Priority Data

May 27, 2011 (JP) ................................. 2011-119619

(51) Int. Cl.
*H05K 1/11* (2006.01)
*H05K 3/42* (2006.01)

(52) U.S. Cl.
CPC ...................................... *H05K 3/425* (2013.01)
USPC ........................................... 174/266; 174/262

(58) Field of Classification Search
CPC ........... H05K 2201/09827; H05K 2201/09845
USPC ............... 174/258–262, 266; 29/847
See application file for complete search history.

(56) References Cited

U.S. PATENT DOCUMENTS

| | | | | |
|---|---|---|---|---|
| 6,873,054 | B2* | 3/2005 | Miyazawa et al. ............. | 257/774 |
| 6,958,544 | B2 | 10/2005 | Sunohara | |
| 2011/0101532 | A1* | 5/2011 | Pohl et al. ...................... | 257/758 |
| 2012/0112361 | A1* | 5/2012 | Han et al. ....................... | 257/774 |
| 2012/0175736 | A1* | 7/2012 | Watanabe ....................... | 257/532 |
| 2012/0228778 | A1* | 9/2012 | Kosenko et al. .............. | 257/774 |
| 2013/0230982 | A1* | 9/2013 | Morita ........................... | 438/653 |

FOREIGN PATENT DOCUMENTS

JP 2004-158537 6/2004

\* cited by examiner

*Primary Examiner* — Yuriy Semenenko
(74) *Attorney, Agent, or Firm* — IPUSA, PLLC

(57) ABSTRACT

A wiring substrate includes a body including first and second surfaces, a trench having an opening on the first surface and including, a bottom surface, a side surface, and a slope surface that connects a peripheral part of the bottom surface to a one end part of the side surface and widens from the peripheral part to the one end part, the one end part being an end part opposite from the first surface, a hole including an end communicating with the bottom surface and another end being open on the second surface, a first layer filling at least a portion of the hole and including a top surface toward the trench, a second layer covering the top surface and formed on at least a portion of the trench except for a part of the side surface, and a third layer covering the second layer and filling the trench.

11 Claims, 17 Drawing Sheets

US 8,729,407 B2

WIRING SUBSTRATE AND METHOD FOR MANUFACTURING WIRING SUBSTRATE

CROSS-REFERENCE TO RELATED APPLICATION

This application is based upon and claims the benefit of priority of the prior Japanese Patent Application No. 2011-119619 filed on May 27, 2011, the entire contents of which are incorporated herein by reference.

FIELD

The present invention generally relates to a wiring substrate and a method for manufacturing a wiring substrate.

BACKGROUND

FIG. 1 is a cross-sectional view of a wiring substrate 100 of a related art example. With reference to FIG. 1, the wiring substrate 100 includes a substrate body 110, a first insulating layer 120, a first conductive layer 130, a second conductive layer 140, a second insulating layer 150, a third insulating layer 160, a first external connection terminal 170, and a second external connection terminal 180.

The substrate body 110 is a part of the wiring substrate 100 serving as a base substrate on which, for example, the first conductive layer 130 is to be formed. A trench 110x and a penetration hole 110y communicating with the trench 110x are formed in the substrate body 110. The first insulating layer 120 is formed on a first surface 110a and a second surface 110b of the substrate body 110, an inner bottom surface of the trench 110x, an inner side surface of the trench 110x, and an inner side surface of the penetration hole 110y.

The first conductive layer 130 is formed on the insulating layer 120 covering the inner bottom surface and the inner side surface of the trench 110x and the inner side surface of the penetration hole 110y. The second conductive layer 140 is formed on the first conductive layer 130. The second conductive layer 140 fills the trench 110x and the penetration hole 110y. The first conductive layer 130 is electrically connected to the second conductive layer 140.

The second insulating layer 150 is formed on the first insulating layer 120 covering the first surface 110a of the substrate body 110, on a portion of the first conductive layer 130, and on a portion of the second conductive layer 140. The second insulating layer 150 includes an opening part 150x. A portion of the second conductive layer 140 is exposed at a bottom part of the opening part 150x.

The third insulating layer 160 is formed on the first insulating layer 120 covering the second surface 110b of the substrate body 110, on a portion of the first conductive layer 130, and on a portion of the second conductive layer 140. The third insulating layer 160 includes an opening part 160x. A portion of the second conductive layer 140 is exposed at a bottom part of the opening part 160x.

The first external connection terminal 170 is formed on the second conductive layer 140 exposed at the bottom part of the opening part 150x. The first external connection terminal 170 is electrically connected to the second conductive layer 140. The second external connection terminal 180 is formed on the second conductive layer 140 exposed at the bottom part of the opening part 160x. The second external connection terminal 180 is electrically connected to the second conductive layer 140.

FIGS. 2 to 4 are diagrams illustrating processes of a method for manufacturing a wiring substrate according to a related art example. First, in the process illustrated in FIG. 2, the trench 110x and the penetration hole 110y communicating with the trench 110x are formed in the substrate body 110. Then, the first insulating layer 120 is formed. The first insulating layer 120 covers the first surface 110a and the second surface 110b of the substrate body 110, the inner bottom surface and the inner side surface of the trench 110x, and the inner side surface of the penetration hole 110y. Then, a first conductive layer 130S is formed on the first insulating layer 120 covering the first surface 110a of the substrate body 110, the inner bottom surface and the inner side surface of the trench 110x, and the inner side surface of the penetration hole 110y. The first conductive layer 130S is formed by, for example, a sputtering method. By removing an unnecessary portion of, for example, the first conductive layer 130S, the first conductive layer 130S eventually becomes the first conductive layer 130.

Then, in the process illustrated in FIG. 3, a copper plate 220 is provided on the insulating layer 120 covering the second surface 110b of the substrate body 110 via an adhesive layer 210. The adhesive layer 210 includes an opening part 210x corresponding to the penetration hole 110y. Then, a second conductive layer 140S is formed by an electroplating method using the copper plate 220 and the first conductive layer 130S as the plating power feed layer. The second conductive layer 140S fills the trench 110x and the penetration hole 110y on which the first insulating layer 120 and the first conductive layer 130S are formed. The second conductive layer 140S covers the first conductive layer 130S formed on the first surface 110a of the substrate body 110. By removing an unnecessary portion of, for example, the second conductive layer 140S, the second conductive layer 140S eventually becomes the second conductive layer 140.

Then, in the process illustrated in FIG. 4, by polishing (e.g., Chemical Mechanical Polishing, CMP) the second conductive layer 140S on the first surface 110a of the substrate body 110, the second conductive layer 140 is formed and the first conductive layer 130S becomes exposed on the first surface 110a of the substrate body 110. Then, the first conductive layer 130 is formed by removing (e.g., etching) the first conductive layer 130S exposed on the first surface 110a of the substrate body 110. Then, the adhesive layer 210 and the copper plate 220 (illustrated in FIG. 3) are removed.

Then, the second insulating layer 150, the third insulating layer 160, the first external connection terminal 170, and the second external connection terminal 180 are formed by a known method. Thereby, the manufacturing of the wiring substrate 100 is completed.

Patent Document 1: Japanese Laid-Open Patent Publication No. 2004-158537

In the above-described process illustrated in FIG. 3, the second conductive layer 140S is formed by an electroplating method using the copper plate 220 and the first conductive layer 130S as the plating power feed layer. In this process, a first plating film is grown on an inner side surface of the trench 110x toward the first conductive layer 130S. The first plating film is grown simultaneously with growing a second plating film on an inner bottom surface of the trench 110x toward the first conductive layer 130S. Further, a third plating film is grown on an inner side surface of the penetration hole 110y toward the first conductive layer 130S. The third plating film is grown simultaneously with growing a fourth plating film on an inner side surface of the penetration hole 110y toward the copper plate 220.

Accordingly, problems such as generation of seams or voids may occur at a bonding part between the above-described plating films grown in multiple directions on the second conductive layer 140S formed in the trench 110x. Further, problems such as generation of seams or voids may occur at a bonding part between the above-described plating films grown in multiple directions on the second conductive layer 140S formed in the penetration hole 110y. The generation of seams or voids tends to occur particularly when the aspect ratio with respect to the trench 110x or the penetration hole 11y becomes larger. In a case where a seam or a void is generated on the second conductive layer 140S, the second conductive layer 140S may become disconnected due to thermal stress. This may lead to a problem of degrading of connection reliability with respect to the first external connection terminal 170 or the second external connection terminal 180.

SUMMARY

According to an aspect of the invention, there is provided a wiring substrate including a substrate body including first and second surfaces, a trench having an opening part formed on the first surface and including an inner bottom surface, an inner side surface, and a slope surface that connects a peripheral part of the inner bottom surface to a one end part of the inner side surface, and widens from the peripheral part of the inner bottom surface to the one end part of the inner side surface, the one end part of the inner side surface being an end part that is opposite from the first surface of the substrate body, a penetration hole including a first end that communicates with the inner bottom surface and a second end that is open on the second surface, a first conductive layer filling at least a portion of the penetration hole and including a top surface toward the trench, a second conductive layer covering the top surface of the first conductive layer and formed on at least a portion of the trench except for a part of the inner side surface, and a third conductive layer covering the second conductive layer and filling the trench.

The object and advantages of the invention will be realized and attained by means of the elements and combinations particularly pointed out in the claims.

It is to be understood that both the foregoing generation description and the followed detailed description are exemplary and explanatory and are not restrictive of the invention, as claimed.

DESCRIPTION OF EMBODIMENTS

In the following, embodiments of the present invention will be described with reference to the accompanying drawings.

[Structure of Wiring Substrate]

Figure 1:
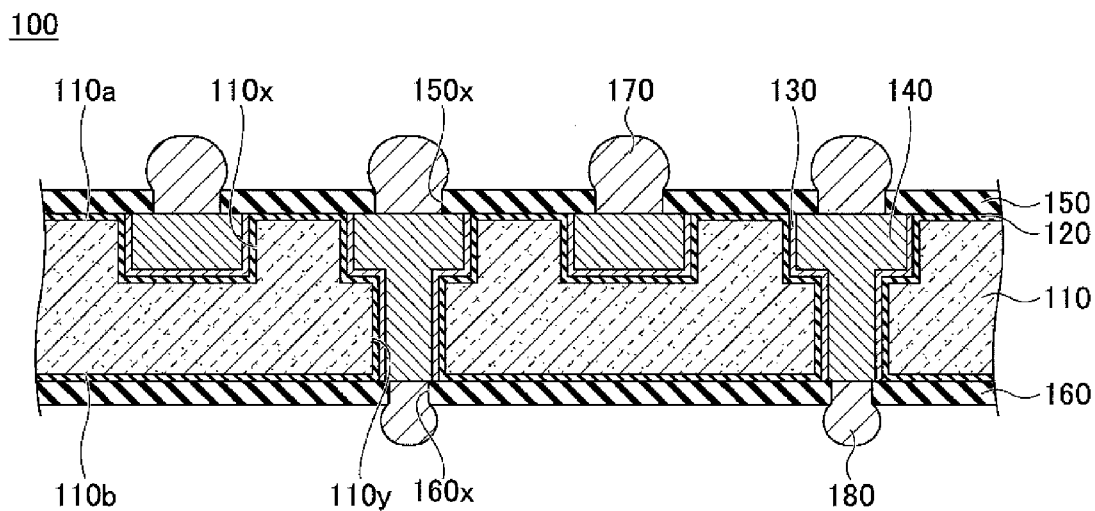
FIG. 1 is a cross-sectional view illustrating a wiring substrate according to a related art example.
Figure 2:
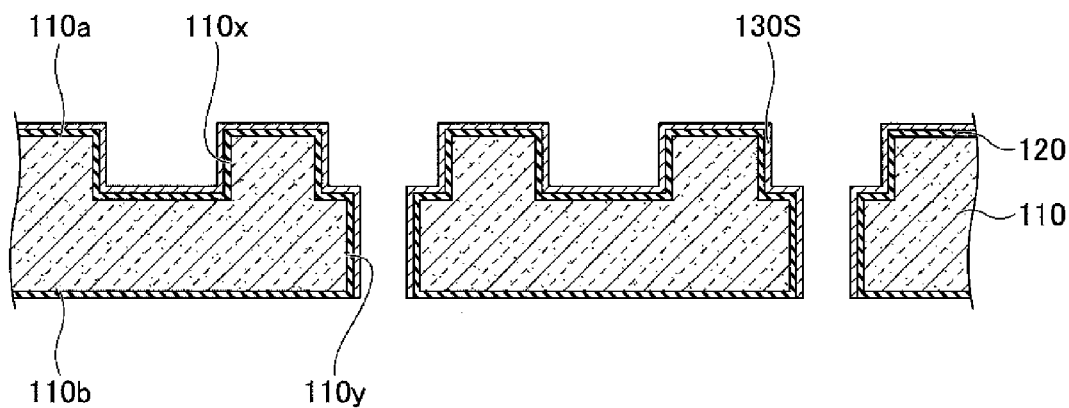
FIGS. 2 to 4 are schematic diagrams illustrating processes of a method for manufacturing a wiring substrate according to a related art example.
Figure 3:
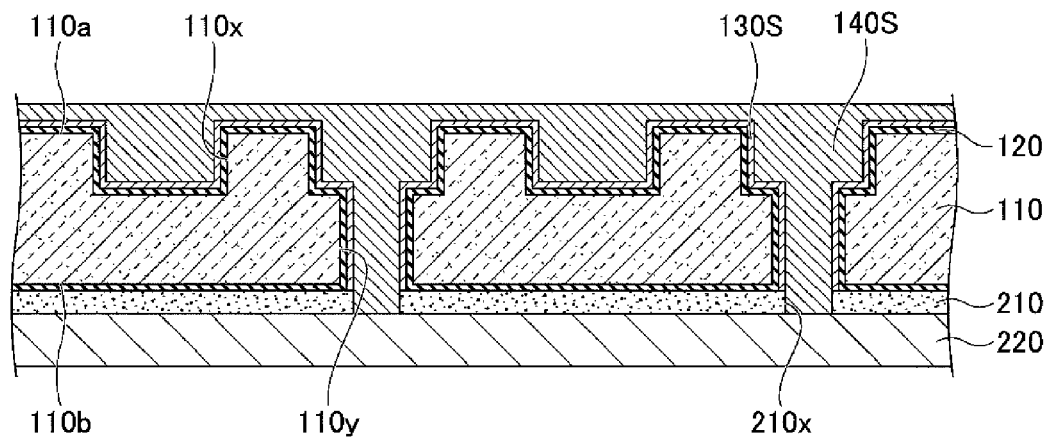
Figure 4:
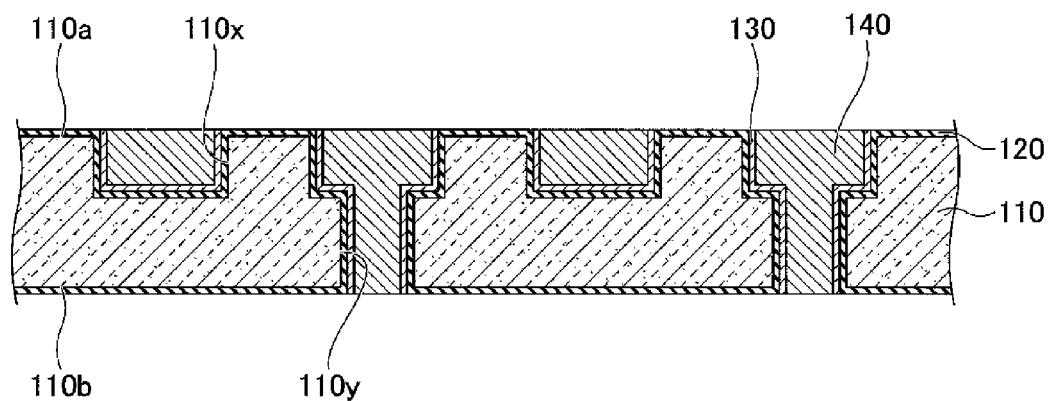
Figure 5:
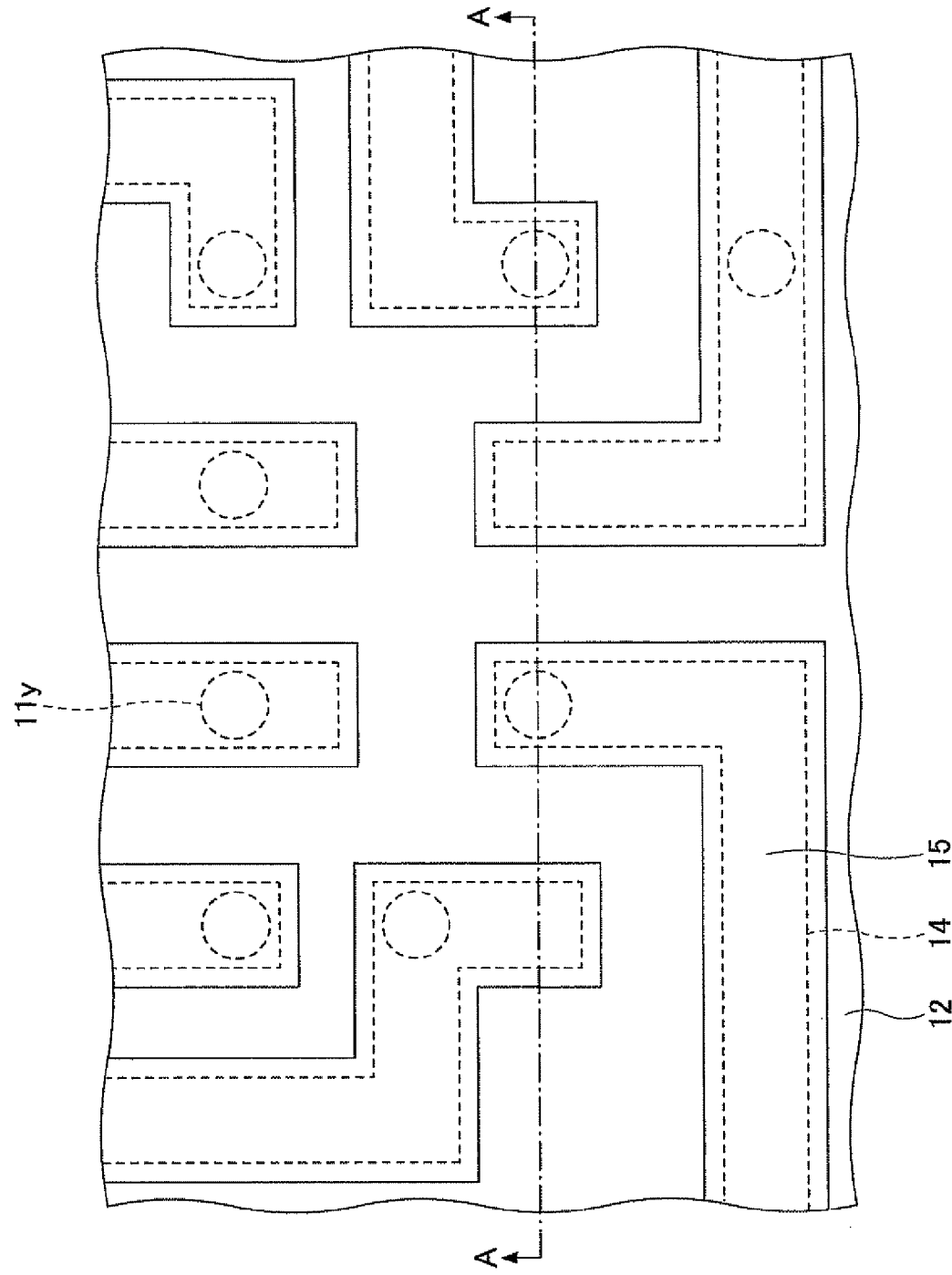
FIG. 5 is a plan view illustrating a wiring substrate according to an embodiment of the present invention.
Figure 6:
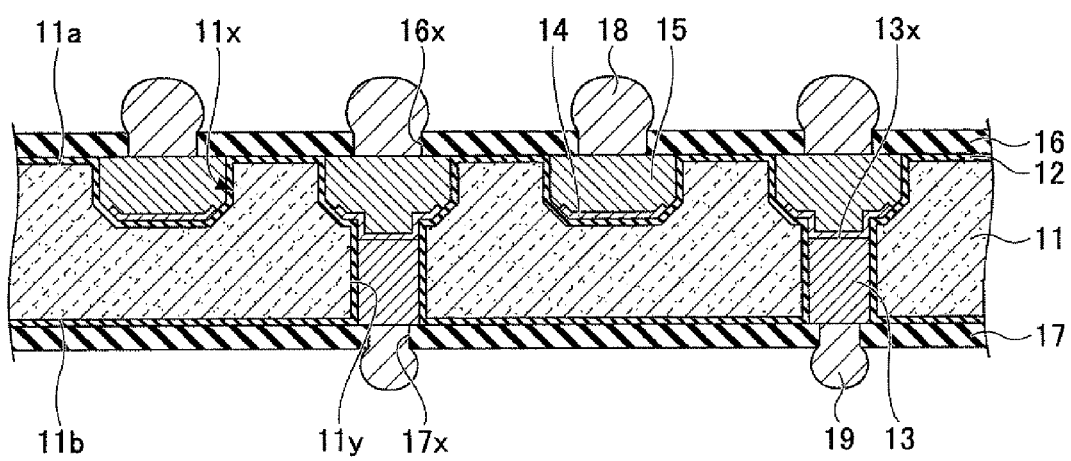
FIG. 6 is a cross-sectional view of the wiring substrate taken along line A-A of FIG. 5.
Figure 7:
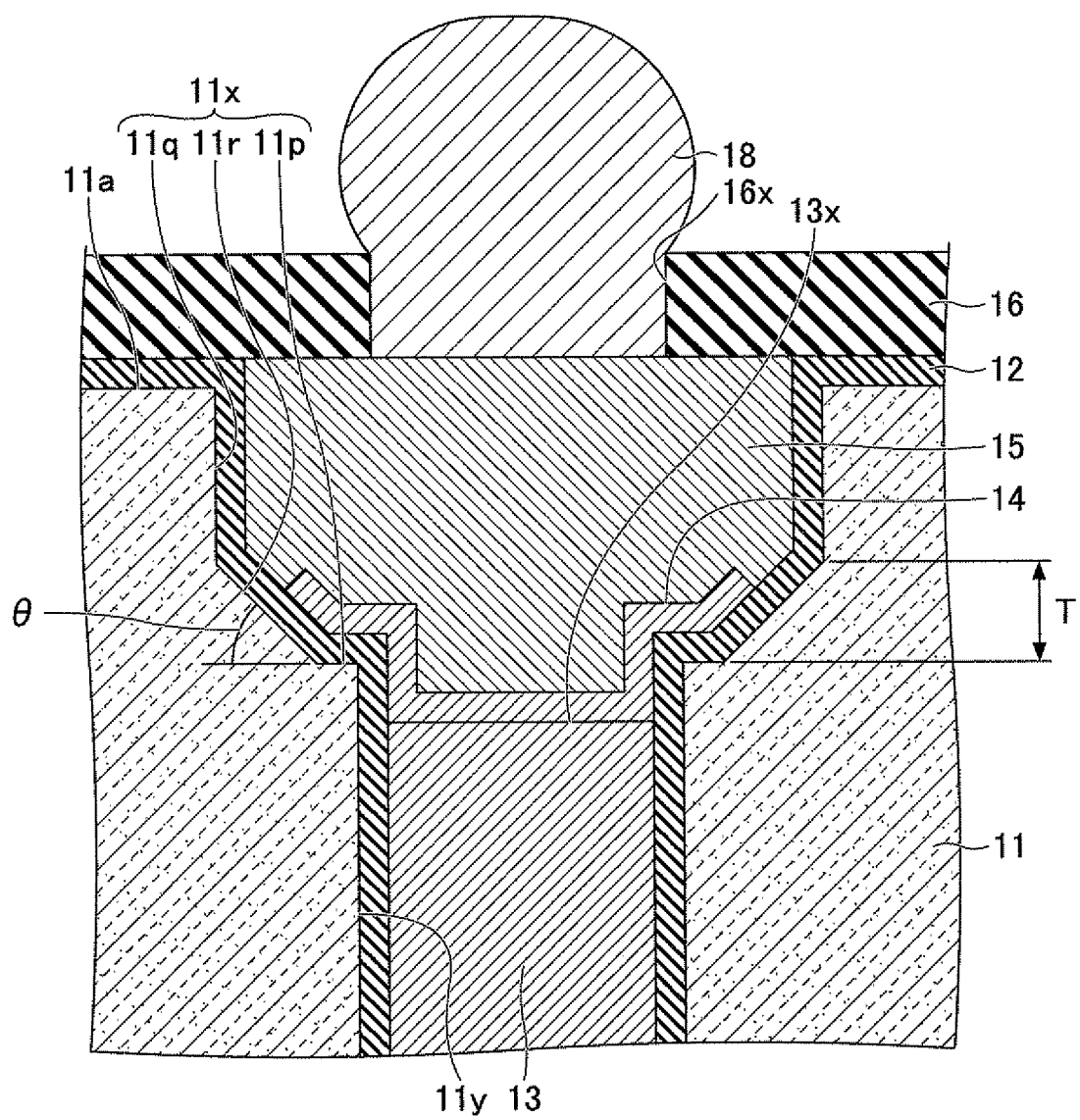
FIG. 7 is an enlarged partial view illustrating the vicinity of a trench illustrated in FIG. 6.

First, a structure of a wiring substrate 10 according to an embodiment of the present invention is described. FIG. 5 is a plan view illustrating the wiring substrate 10 according to an embodiment of the present invention. FIG. 6 is a cross-sectional view of the wiring substrate 10 taken along line A-A of FIG. 5. FIG. 7 is an enlarged partial view illustrating the vicinity of the trench 11x of FIG. 6. It is to be noted that a second insulating layer 16 and first external connection terminal 18 are not illustrated in FIG. 5 for the sake of convenience.

With reference to FIGS. 5-7, the wiring substrate 10 includes a substrate body 11, a first insulating layer 12, a first conductive layer 13, a second conductive layer 14, a third conductive layer 15, the second insulating layer 16, a third insulating layer 17, the first external connection terminal 18, and a second external connection terminal 19.

The substrate body 11 is a part of the wiring substrate 10 serving as a base substrate on which, for example, the first conductive layer 13 is to be formed. A trench 11x and a penetration hole fly are formed in the substrate body 11. The thickness of the substrate body 11 may be, for example, approximately 200 μm to 400 μm. For example, silicon, glass, or ceramic may be used as the material of the substrate body 11.

It is to be noted that the wiring substrate 10 may be manufactured into a semiconductor package by mounting a semiconductor chip on the wiring substrate 10. From the standpoint of matching the thermal expansion coefficient with respect to the semiconductor chip, the material of the substrate body 11 is preferably silicon or a borosilicate glass having a thermal expansion coefficient similar to silicon because the semiconductor chip often includes a silicon substrate. The borosilicate glass is a glass mainly including boric acid ($B_2O_3$) or silicic acid ($SiO_2$) and has a thermal expansion coefficient of approximately 3 ppm/° C. In addition, from the standpoint of processing, the material of the substrate body 11 is preferably silicon.

The thermal expansion coefficient of the substrate body 11 is matched with the thermal expansion coefficient of the semiconductor chip for reducing thermal stress generated at a bonding part between the wiring substrate 10 and the semiconductor chip in view of operating under a high temperature atmosphere or a low temperature atmosphere. In this embodiment, the substrate body 11 is formed of silicon.

The trench 11x is open on the side of a first surface 11a (first surface side) of the substrate body 11. The trench 11x corresponds to a portion of the substrate body 11 at which a wiring pattern including the third conductive layer 15 is to be formed. Accordingly, the trench 11x may be adaptively formed in a position corresponding to the shape of the wiring pattern (see, for example, FIG. 5). The width of the trench 11x may be, for example, approximately 50 μm to 70 μm. The depth of the trench 11x may be, for example, approximately 40 μm to 60 μm. The pitch between the trenches 11x may be, for example, approximately 80 μm to 100 μm.

The trench 11x includes an inner bottom surface 11p, an inner side surface 11q, and a slope surface 11r connecting a peripheral part of the inner bottom surface 11p and a one end part of the inner side surface 11q. The one end part of the inner side surface 11q is an end part that is opposite from the first surface 11a of the substrate body 11. The inner bottom surface 11p and the inner side surface 11q are substantially orthogonal to each other. The slope surface 11r is inclined and widens from the peripheral part of the inner bottom surface 11p to the one end part of the inner side surface 11q. In other words, the trench 11x is formed by connecting the peripheral part of the inner bottom surface 11p to the one end part of the inner side surface 11q (the end part of the inner side surface 11q opposite from the first surface 11a of the substrate body 11) via the slope surface 11r that widens from the peripheral part of the inner bottom surface 11p to the one end part of the inner side surface 11q. In this embodiment, the phrase "the slope surface 11r widens from the peripheral part of the inner bottom surface 11p to the one end part of the inner side surface 11q" indicates that the slope surface 11r is inclined from the peripheral part of the inner bottom surface 11p to the one end part of the inner side surface 11q so that the area of the opening of the trench 11x (formed on the first surface 11a) is greater than the area of the inner bottom surface 11p.

The height T (i.e. height of the slope surface 11r in the thickness direction of the substrate body 11) of the slope surface 11r may be, for example, approximately 10% to 20% of the width of the trench 11x (e.g., approximately 50 μm to 70 μm). The inclination angle θ of the slope surface 11r with respect to the bottom surface 11p may be, for example, approximately 45 degrees to 55 degrees. The cross-section of the slope surface 11r may have a shape other than a straight line. For example, the cross-section of the slope surface 11r may be a curved line or a combination of a straight line and a curved line. In other words, the slope surface 11r may be a flat surface, a curved surface, or a shape including a flat surface and a curved surface.

The penetration hole fly has one end that communicates with the inner bottom surface 11p of the groove 11x and another end that is open on the side of a second surface 11b (second surface side) of the substrate body 11. The penetration hole 11y is a so-called through silicon via (TSV). In this embodiment, the penetration hole 11y has a substantially circular shape from a plan view. The penetration hole 11y corresponds to a portion of the substrate body 11 at which the first conductive layer 13 is to be formed. The diameter of the penetration hole 11y may be, for example, approximately 40 μm to 60 μm. The depth of the penetration hole 11y may be, for example, approximately 140 μm to 360 μm. Thus, the penetration hole 11y has a relatively high aspect ratio. It is to be noted that, although some of the trenches 11x are not illustrated in communication with the penetration holes 11y in the cross-sectional view of FIG. 6, these trenches 11x are also in communication with the penetration holes 11y (see, for example, FIG. 5).

The insulating layer 12 is formed on the first and the second surfaces 11a, 11b of the substrate body 11; the inner bottom surface 11p, the inner side surface 11q, and the slope surface 11r of the trench 11x; and an inner side surface of the penetration hole 11y. The insulating layer 12 is for insulating the substrate body 11 from the first conductive layer 13, the second conductive layer 14, and the third conductive layer 15. For example, silicon dioxide ($SiO_2$), silicon nitride (SiN), or polyimide (PI) may be used as the material of the insulating layer 12. The thickness of the insulating layer 12 may be, for example, approximately 1 μm to 2 μm. In this embodiment, the insulating layer 12 is provided because the substrate body 11 is formed of silicon (semiconductor material). However, in a case where the substrate body 11 is formed of an insulating material such as glass, the wiring substrate 10 may be formed without the insulating layer 12.

The first conductive layer 13 fills at least a portion of the penetration hole 11y having its inner side surface covered by the insulating layer 12. In this embodiment, the first conductive layer 13 fills the penetration hole 11y except at an upper portion of the penetration hole 11y (i.e. a portion of the penetration hole 11y toward the trench 11x). A top surface of the first conductive layer 13 (i.e. surface of the first conductive layer 13 toward the trench 11x) is in a position in which the top surface of the first conductive layer 13 is recessed toward the second surface 11b of the substrate body 11 to the inner bottom surface 11p. In other words, the top surface of the first conductive layer 13 (i.e. surface of the first conductive layer 13 toward the trench 11x) and a portion of the insulating layer 12 covering the inner side surface of the penetration hole 11y constitute a recess part 13x.

Alternatively, the first conductive layer 13 may fill the entire penetration hole 11y (including the upper portion of the penetration hole 11y toward the trench 11x) having its inner surface covered by the insulating layer 12. In this case, the top surface of the first conductive layer 13 (i.e. surface of the first conductive layer 13 toward the trench 11x) is substantially flush with the top surface of the first insulating layer 12 covering the inner bottom surface 11p of the trench 11x. In this case, the first conductive layer 13 may be formed without the recess part 13x. In a case where the recess part 13x is formed, the recess part 13x has a depth of, for example, approximately 0 μm to 10 μm.

It is, however, to be noted that the first conductive layer 13 is preferred not to project from the inner bottom surface 11p of the trench 11x. In such a case where the first conductive layer 13 projects from the inner bottom surface 11p of the trench 11x, the projection would prevent the second conductive layer 14 from satisfactorily covering the first conductive layer 13 and the first insulating layer 12. This may lead to problems such as peeling or disconnection of the second conductive layer 14. In order to avoid such problems, the first conductive layer 13 fills the penetration hole 11y to a degree that the top surface of the first conductive layer 13 (i.e. surface of the first conductive layer 13 toward the trench 11x) is recessed toward the second surface 11b of the substrate body 11 to the inner bottom surface 11p. That is, in this embodiment, the recess part 13x is formed.

For example, copper (Cu) may be used as the material of the first conductive layer 13. The first conductive layer 13 constitutes an electrode that electrically connects a wiring pattern including the third conductive layer 15 to the first external connection terminal 18 via the second conductive layer 14.

The second conductive layer 14 is formed inside the recess part 13x and a portion of the trench 11x. More specifically, the second conductive layer 14 covers the top surface of the first conductive layer 13 (surface of the first conductive layer 13 toward the trench 11x) and the first insulating layer 12 covering the inner side surface of the penetration hole 11y in both embodiments where the recess part 13x is formed and where the recess part 13x is not formed (i.e. a case where the top surface of the first conductive layer (surface of the first conductive layer 13 toward the trench 11x) is substantially flush with the first insulating layer 12 formed on the inner side surface 11p of the trench 11x). The second conductive layer 14 is formed on the entire first insulating layer 12 covering the inner bottom surface 11p of the trench 11x and on a portion of the first insulating layer 12 covering the slope surface 11r of the trench 11x (i.e. excluding a part of the slope surface 11r toward the inner side surface 11q). In other words, the second conductive layer 14 is not formed on an outer rim part of the first insulating layer 12 covering the slope surface 11r of the trench 11x. Thus, the first insulating layer 12 is exposed at an outer rim part of the slope surface 11r. In this embodiment, the first insulating layer 12 exposed at the outer rim part of the slope surface 11r has a belt-like shape having a substantially constant width of approximately a few μm. The second conductive layer 14 is electrically connected to the first conductive layer 13 and the third conductive layer 15.

The second conductive layer 14 may be formed by layering a titanium (Ti) film and a copper (Cu) film on the first conductive film 13 and the first insulating layer 12 in this order. By using a titanium (Ti) film, a satisfactory adhesiveness between the second conductive layer 14 and the first insulating layer 12 can be attained in a case where the material of the first insulating layer 12 is silicon dioxide ($SiO_2$) or silicon nitride (SiN). The thickness of the second conductive layer 14 may be, for example, approximately 1 μm.

The third conductive layer 15 covers the second conductive layer 14 and fills the trench 11x. A top surface of the third conductive layer 15 is substantially flush with a top surface of the first insulating layer 12 covering the first surface 11a of the substrate body 11. For example, copper (Cu) may be used as the material of the third conductive layer 15. The third conductive layer 15 constitutes a wiring pattern. The material of the third conductive layer 15 is, for example, copper (Cu). In a case where the material of the first insulating layer 12 is silicon dioxide ($SiO_2$) or silicon nitride (SiN), the third conductive layer 15 and the first insulating layer 12 do not adhere to each other. However, adhesive strength is not a concern because the third conductive layer 15 adheres to the first insulating layer 12 or the first conductive layer 13 via the second conductive layer 14.

In this embodiment, the second conductive layer 14 is interposed between the first conductive layer 13 and the third conductive layer 15. This owes to the processes of the following method for manufacturing the wiring substrate 10 according to an embodiment of the present invention. As described in the following method for manufacturing the wiring substrate 10 according to an embodiment of the present invention, the first and the third conductive layers 13, 15 can prevent the generation of defects such as seams and voids.

The second insulating layer 16 is formed on the first insulating layer 12 covering the first surface 11a of the substrate body 11 and the third conductive layer 15 exposed at the trench 11x. The second insulating layer 16 includes an opening part 16x. A portion of the third conductive layer 15 is exposed at a bottom part of the opening part 16x. The third conductive layer 15 exposed at the opening part 16x functions as an electrode pad of the first external connection terminal 18. For example, an insulating resin such as benzo-cyclo-butene (BOB), poly-benzo-oxazole (PBO), or polyimide (PI) may be used as the material of the second insulating layer 16. For example, a photosensitive resin composition including an epoxy type resin or an imide type resin may be used as the material of the second insulating layer 16. The thickness of the second insulating layer 16 may be, for example, approximately 5 μm to 30 μm.

According to necessity, a metal layer may be formed on the third conductive layer 15 exposed at the bottom part of the opening part 16x. For example, the metal layer may a gold (Au) layer, a nickel/gold (Ni/Au) layer (i.e. a metal layer including a Ni layer and a Au layer layered in this order), or a nickel/palladium/gold (Ni/Pd/Au) layer (i.e. a metal layer including a Ni layer, a Pd layer, and a Au layer layered in this order).

Alternatively, for example, a solder plating alloy of tin/silver (Sn/Ag) or tin/silver/copper (Sn/Ag/Cu) may be used as the material of the metal layer. By forming the metal layer, the connection reliability between, for example, the third conductive layer 15 and the first external connection terminal 18 can be improved.

The third insulating layer 17 is formed on the first insulating layer 12 covering the second surface 11b of the substrate body 11 and the first conductive layer 13 exposed at the penetration hole fly. The third insulating layer 17 includes an opening part 17x. A portion of the first conductive layer 13 is exposed at the opening part 17x. The first conductive layer 13 exposed at the opening part 17x functions as an electrode pad of the second external connection terminal 19. Because the material and the thickness of the third insulating layer 17 are the same as those of the second insulating layer 16, the material and the thickness of the third insulating layer 17 are not described.

Similar to the metal layer formed on the third conductive layer 15 exposed at the opening part 16x, a metal layer may be formed on the first conductive layer 13 exposed at the opening part 17x according to necessity. By forming the metal layer, the connection reliability between, for example, the first conductive layer 13 and the second external connection terminal 19 can be improved.

The first external connection terminal 18 is formed on the third conductive layer 15 exposed at the opening part 16x. In a case where the metal layer is formed on the third conductive layer 15 exposed at the opening part 16x, the first external connection terminal 18 is formed on the metal layer. The second external connection terminal 19 is formed on the first conductive layer 13 exposed at the opening part 17x. In a case where the metal layer is formed on the first conductive layer 13 exposed at the opening part 17x, the second external connection terminal 19 is formed on the metal layer.

The first and the second external connection terminals 18, 19 are terminals for electrically connecting the wiring substrate 10 to, for example, a semiconductor chip or another wiring substrate. For example, solder bumps may be used as the first and the second external connection terminals 18, 19. In a case where the first and the second external connection terminals 18, 19 are solder bumps, the material of the solder bumps may be, for example, an alloy including lead (Pb), an alloy including tin (Sn) and copper (Cu), an alloy including tin (Sn) and silver (Ag), or an alloy including tin (Sn), silver (Ag), and copper (Cu).

A multilayer wiring may be formed on the second insulating layer 16 or the third insulating layer 17 by alternately layering a wiring layer(s) and an insulating layer(s) on top of each other.

[Method for Manufacturing Wiring Substrate]

Next, a method for manufacturing a wiring substrate according to an embodiment of the present invention is described. FIGS. 8 to 22 illustrate the steps of the method for manufacturing a wiring substrate according to an embodiment of the present invention.

Figure 8:
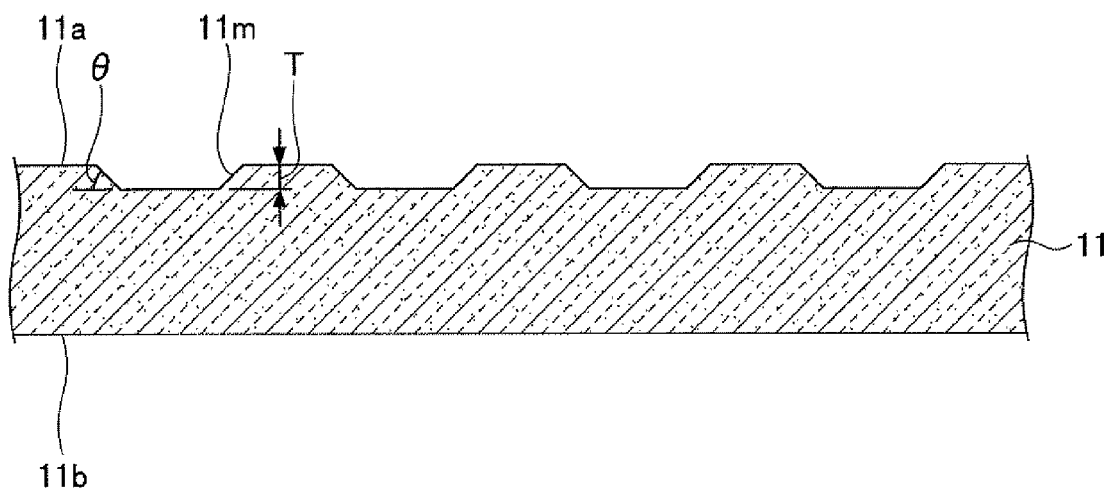
FIGS. 8 to 22 are schematic diagrams illustrating processes of a method for manufacturing a wiring substrate according to an embodiment of the present invention.

First, in the process illustrated in FIG. 8, the substrate body 11 is prepared. Then, a trench 11m, which eventually becomes a part of the trench 11x, is formed on the first surface side of the substrate body 11. The shape of the cross section of the trench 11m is substantially an inverted trapezoid. The trench 11m has a sidewall including a slope surface which eventually becomes the slope surface 11r of the trench 11x. The trench 11x corresponds to a part of the substrate body 11 at which a wiring pattern including the third conductive layer 15 is to be formed. Accordingly, the trench 11m, which eventually becomes a part of the trench 11x, is adaptively formed in a position corresponding to the shape of the wiring pattern. For example, the substrate body 11 may be a silicon wafer having a diameter of 6 inches (approximately 150 mm), 8 inches (approximately 200 mm), or 12 inches (approximately 300 mm). The thickness of the silicon wafer may be, for example, 0.625 mm (in a case of a 6 inch wafer), 0.725 mm (in a case of an 8 inch wafer), or 0.775 mm (in a case of a 12 inch wafer). It is, however, to be noted that, the thickness of the silicon wafer may be reduced by using, for example, a backside grinder.

For example, in a case where the silicon wafer has a crystal orientation of (100) or (110), the trench 11m is formed by etching the silicon wafer in an orthogonal direction or a parallel direction with respect to the crystal orientation of (100) or (110). An example of forming the trench 11m is described below.

For example, a resist layer (not illustrated) is formed on the first surface 11a of the substrate body 11. The resist layer has an opening corresponding to an area at which the trench 11m is to be formed. Then, the substrate body 11 is etched by using the resist layer as a mask. Thereby, the trench 11x is formed. Assuming that the first surface 11a of the substrate body 11 is the (100) silicon crystal plane, the trench 11m is formed by etching the (100) silicon crystal plane. For example, the etching may be performed by an anisotropic etching method using an alkali solution including potassium hydroxide (KOH) or tetra-methyl-ammonium-hydroxide (TMAH).

Because the etching rate of the (111) silicon crystal plane is significantly slower than the etching rate of the (100) silicon crystal plane, the (111) silicon crystal plane (corresponding to the slope surface 11r) having a slower etching rate appears by etching the (100) silicon crystal plane with a solution of potassium hydroxide (KOH) or tetra-methyl-ammonium-hydroxide (TMAH). Thereby, the trench him having substantially an inverted trapezoid shape is formed.

The width of the trench 11m may be, for example, approximately 50 μm to 70 μm. For example, the height of the trench 11m (height of the substrate body 11 in its thickness direction) may be approximately 10% to 20% of the width of the trench 11m (e.g., approximately 50 μm to 70 μm). The pitch between the trenches 11m may be, for example, approximately 80 μm to 100 μm. In this example, the inclination angle θ of the slope surface of the trench 11m with respect to the inner bottom surface of the trench 11m is 54.7 degrees. In a case where the first surface 11a of the substrate body 11 is assumed as the (110) silicon crystal plane, the inclination angle θ of the slope surface of the trench 11m with respect to the inner bottom surface of the trench 121m is 45 degrees.

Figure 9:
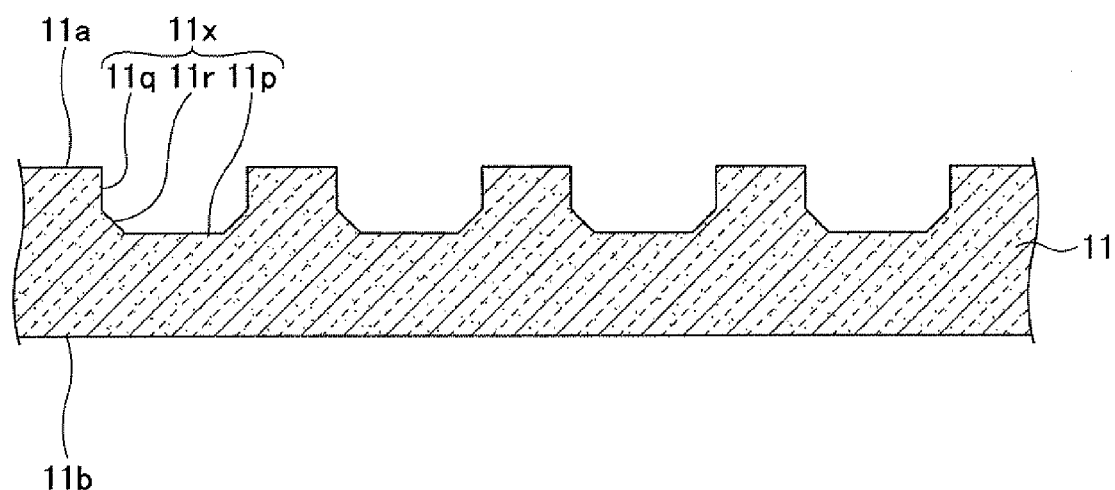

Then, in the process illustrated in FIG. 9, the forming of the trench 11x is completed by further processing the inside of the trench 11m. The completed trench 11x includes the inner bottom surface 11p, the inner side surface 11q, and the slope surface 11r connecting the peripheral part of the inner bottom surface 11p and the one end part of the inner side surface 11q. In a state where the resist layer (not illustrated) being used in the process of FIG. 8 is not removed, the trench 11x is formed by etching the substrate body 11 (the inside of the trench 11m) by using the resist layer (not illustrated) as a mask. It is preferable for the etching to be anisotropic etching such as deep reactive ion etching (DRIE) using sulfur hexafluoride ($SF_6$). The depth of the trench 11x (i.e. distance between the first surface 11a of the substrate body 11 and the inner bottom surface 11p) may be, for example, approximately 40 μm to 60 μm. It is to be noted that the shape of the cross section of the slope surface 11r is not limited to a straight line. For example, the cross section of the slope surface 11r may be a curved line or a combination of a straight line and a curved line.

Figure 10:
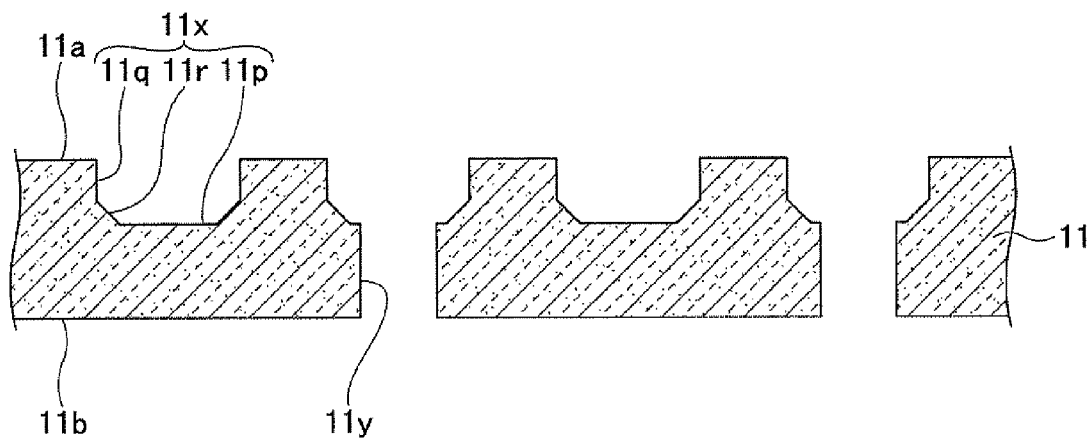

Then, in the process illustrated in FIG. 10, the penetration hole 11y is formed. The penetration hole 11y has one end that communicates with the groove 11x formed on the first surface side 11a of the substrate body 11 and another end that is open on the second surface side 11b of the substrate body 11. For example, a resist layer (not illustrated) is formed on the substrate body 11. The resist layer has an opening corresponding to an area at which the penetration hole 11y is to be formed. Then, the substrate body 11 is etched by using the resist layer as a mask. Thereby, the penetration hole 11y is formed. It is preferable for the etching to be anisotropic etching such as deep reactive ion etching (DRIE) using sulfur hexafluoride ($SF_6$). In this embodiment, the penetration hole 11y has a substantially circular shape from a plan view. The diameter of the penetration hole 11y may be, for example, approximately 40 μm to 60 μm. The depth of the penetration hole 11y may be, for example, approximately 140 μm to 360 μm. A process of forming a thermal oxide film ($SiO_2$) covering the first surface 11a of the substrate body 11 and the inner bottom surface 11p, the inner side surface 11q, and the slope surface 11r of the trench 11x may be performed between the process illustrated in FIG. 9 and the process illustrated in FIG. 10.

Figure 11:
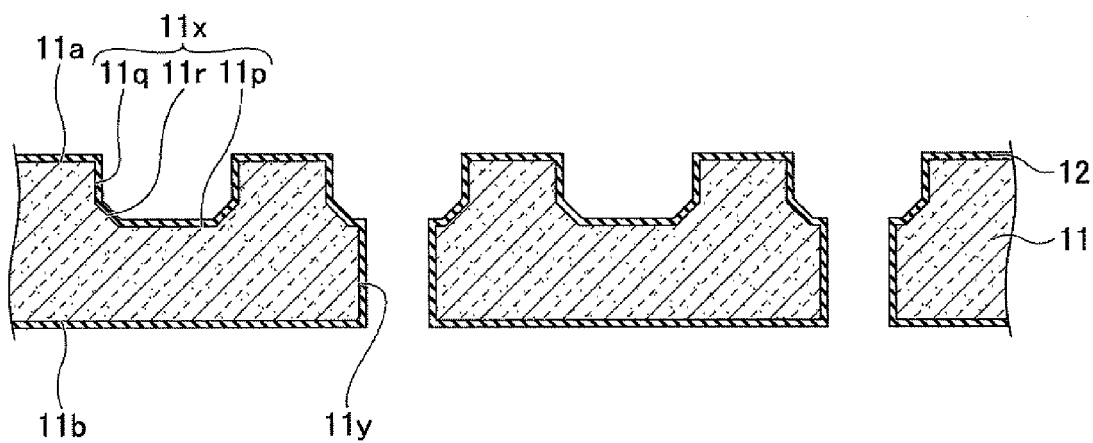

Then, in the process illustrated in FIG. 11, the first insulating layer 12 is formed on the first and the second surfaces 11a, 11b of the substrate body 11; the inner bottom surface 11p, the inner side surface 11q, and the slope surface 11r of the trench 11x; and the inner side surface of the penetration hole 11y. For example, a thermal oxide film ($SiO_2$) may be used as the first insulating layer 12. The first insulating layer 12 may be formed by performing thermal oxidation using a wet thermal oxidation method on the substrate body 11 in which the vicinity of the surface of the substrate body 11 is heated to a temperature of, for example, 1000° C. or more. The thickness of the first insulating layer 12 may be, for example, approximately 1 μm to 2 μm. Alternatively, the first insulating layer 12 may be a silicon dioxide ($SiO_2$) film, a silicon nitride (SiN) film, or a polyimide (PI) film formed by using, for example, a chemical vapor deposition (CVD) method. In the above-described case of performing the process of forming the thermal oxide film ($SiO_2$) between the process illustrated in FIG. 9 and the process illustrated in FIG. 10, the thermal oxide film ($SiO_2$) formed between the process illustrated in FIG. 9 and the process illustrated in FIG. 10 is to be removed before performing the process illustrated in FIG. 11. After the thermal oxide film ($SiO_2$) formed between the process illustrated in FIG. 9 and the process illustrated in FIG. 10 is removed, the first insulating layer 12 is formed in the process illustrated in FIG. 11.

Figure 12:
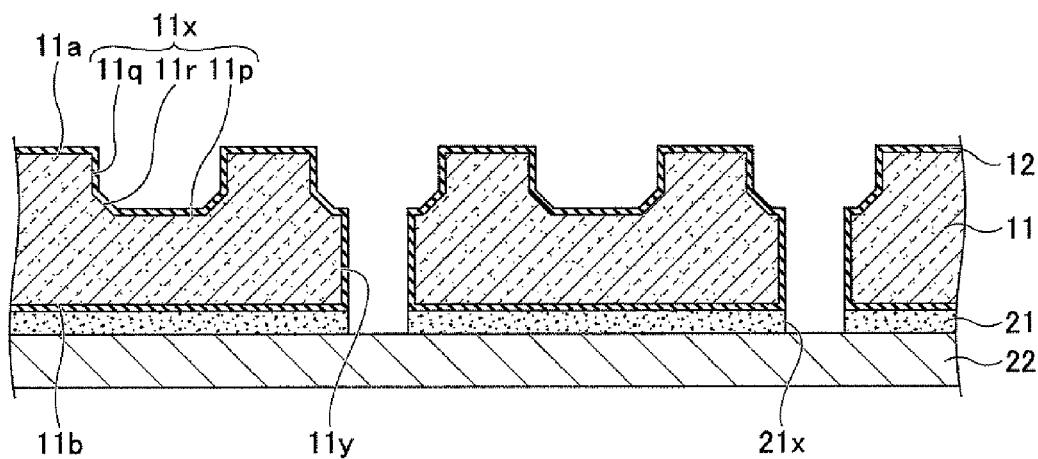

Then, in the process illustrated in FIG. 12, a metal layer 22 is formed on the first insulating layer 12 covering the second surface 11b of the substrate body 11 via an adhesive layer 21. Then, an opening part 21x is formed by removing (e.g., ashing) a portion of the adhesive layer 21 corresponding to the penetration hole 11y having its inner side surface covered by the first insulating layer 12. Thereby, a top surface of the metal layer 22 is exposed at the bottom part of the penetration hole 11y having its inner side surface covered by the first insulating layer 12. The metal layer 22 is a member to be used as a feeding layer when forming, for example, the first conductive layer 13 by using an electroplating method. For example, a copper (Cu) plate or a copper (Cu) foil may be used as the material of the metal layer 22. In this embodiment, a copper (Cu) plate is used as the metal layer 22.

Figure 13:
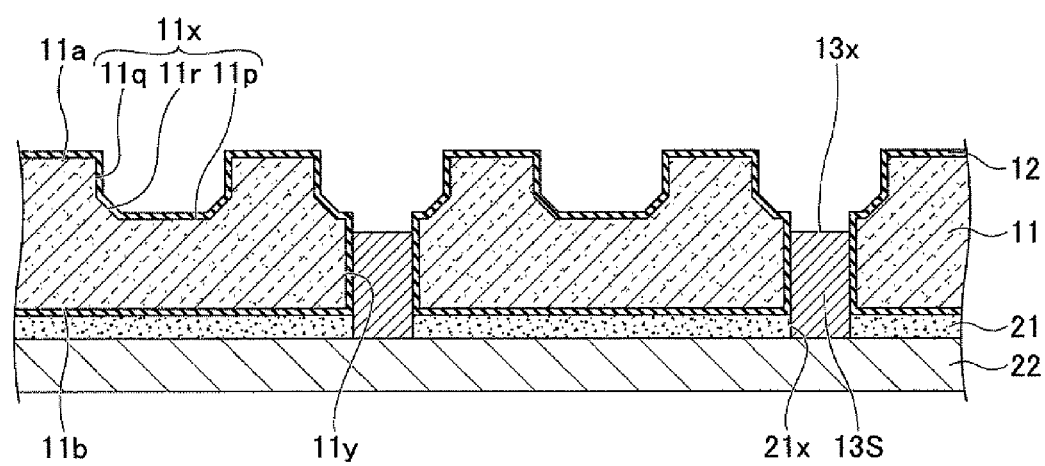

Then, in the process illustrated in FIG. 13, a plating film is deposited (grown) inside the penetration hole 11y from the side of the metal layer 22 by performing an electroplating method using the metal layer 22 as a power feed layer (power supply layer). Thereby, a first conductive layer 13S filling at least a portion of the penetration hole 11y is formed. By removing an unnecessary portion of, for example, the first conductive layer 13S, the first conductive layer 13S eventually becomes the first conductive layer 13. For example, copper (Cu) may be used as the material of the first conductive layer 13S. The forming of the first conductive layer 13S is not to be limited as long as a portion except for an upper portion of the penetration hole 11y (toward the trench 11x) is filled. In this case, the recess part 13x is formed by the top surface of the first conductive layer 13S (i.e. surface of the first conductive layer 13S toward the trench 11x) and the first insulating layer 12 covering the inner side surface of the penetration hole 11y.

As described above, the first conductive layer 13S may be formed filling the entire penetration hole 11y (including the upper portion of the penetration hole 11y (toward the trench 11x)) having its inner side surface covered by the first insulating layer 12. That is, the first conductive layer 13S may be formed, so that the top surface of the first conductive layer 13S (i.e. surface of the first conductive layer 13S toward the trench 11x) is substantially flush with the first insulating layer 12 formed on the inner bottom surface 11p of the trench 11x. Nevertheless, it is not preferable to form the first conductive layer 13S projecting from the inner bottom surface 11p of the trench 11x. The depth of the recess part 13x may be, for example, approximately 0 μm to 10 μm.

Because the inner side surface of the penetration hole 11y is covered by the first insulating layer 12, the first conductive layer 13S can be formed by growing a plating film only from one side (in this embodiment, from the side of metal layer 22). Accordingly, unlike the wiring substrate 100 of the related art example, the generation of, for example, seams or voids due to growing plating films from two directions can be prevented. As a result, the first conductive layer 13S can be prevented from being disconnected by thermal pressure due to the generation of, for example, seams or voids. Further, the first conductive layer 13S can prevent reduction of connection reliability with respect to the second external connection terminal 19.

Figure 14:
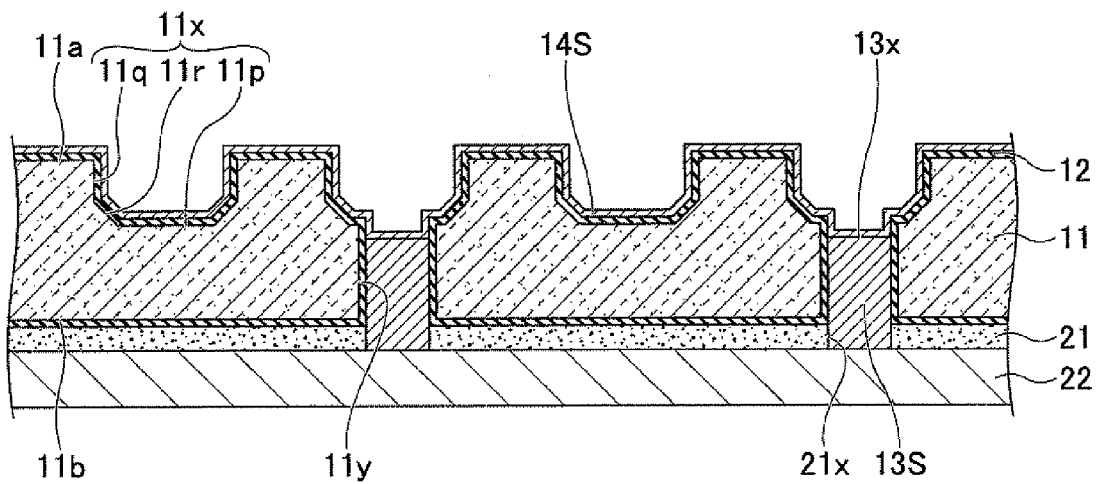

Then, in the process illustrated in FIG. 14, a second conductive layer 14S is formed. The conductive layer 14S covers the first insulating layer 12 covering the first surface 11a of the substrate body 11, the inner bottom surface 11p, the inner side surface 11q, and the slope surface 11r of the trench 11x, and the recess part 13x. The second conductive layer 14S may be formed by, for example, a sputtering method. By removing an unnecessary portion of, for example, the second conductive layer 14S, the second conductive layer 14S eventually becomes the second conductive layer 14. The second conductive layer 14S may be formed by layering a titanium (Ti) film and a copper (Cu) film on the first insulating layer 12 or the first conductive layer 13 in this order. The second conductive layer 14S may have a thickness of, for example, approximately 1 μm.

Figure 15:
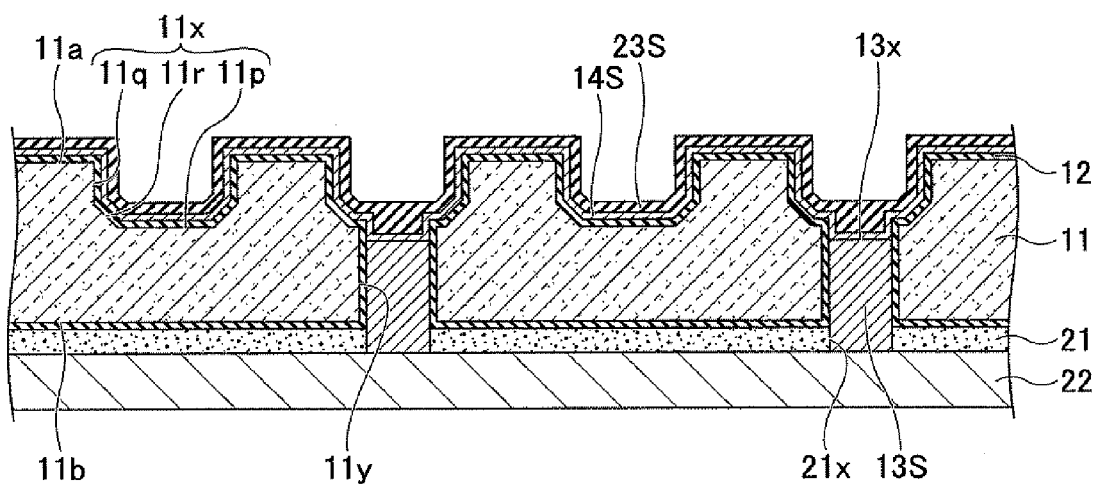

Then, in the process illustrated in FIG. 15, a resist layer 23S covering the second conductive layer 14S is formed. By removing an unnecessary portion of, for example, the resist layer 23S, the resist layer 23S eventually becomes the resist layer 23. More specifically, a resist liquid or a resist paste including a photosensitive resin composition containing an epoxy type resin or an imide type resin is applied to the second conductive layer 14S. Alternatively, a resist film (e.g., dry film resist) including a photosensitive resin composition containing an epoxy type resin or an imide type resin is laminated to the second conductive layer 14S. The thickness of the resist layer 23S may be, for example, approximately a few μm. Although a positive type resist is used as the resist layer 23S in this embodiment, a negative type resist may be used as the resist layer 23S.

Figure 16:
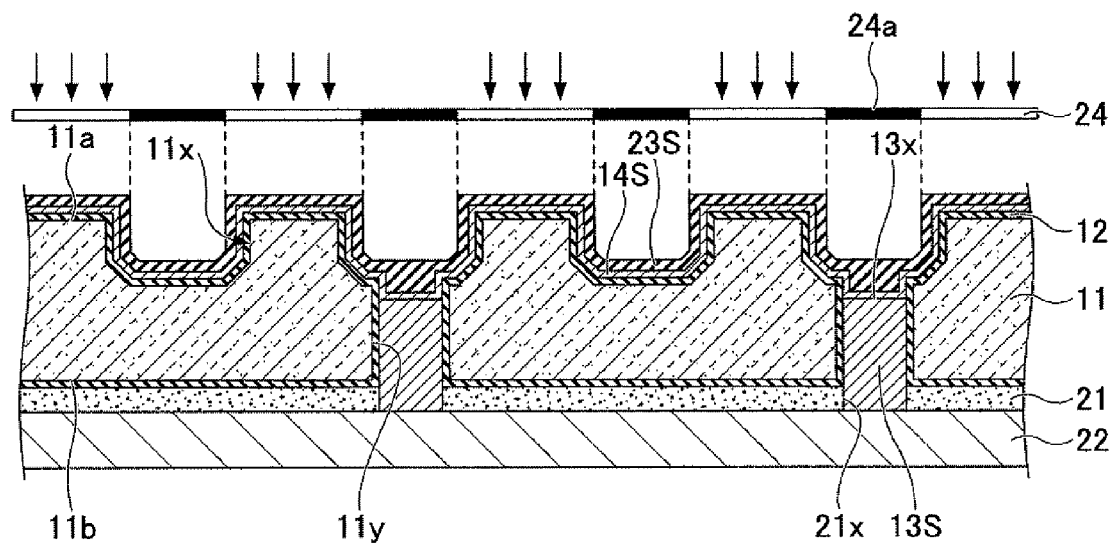

Then, in the process illustrated in FIG. 16, the resist layer 23S is exposed to light radiated in the arrow direction via a mask 24 including a shading part 24a. In this embodiment, the shading part 24a is formed, so that the resist layer 23S, which is formed on the first surface 11a of the substrate body, the inner side surface 11q of the trench 11x, and a part of the slop surface 11r of the trench 11x, is exposed.

Figure 17:
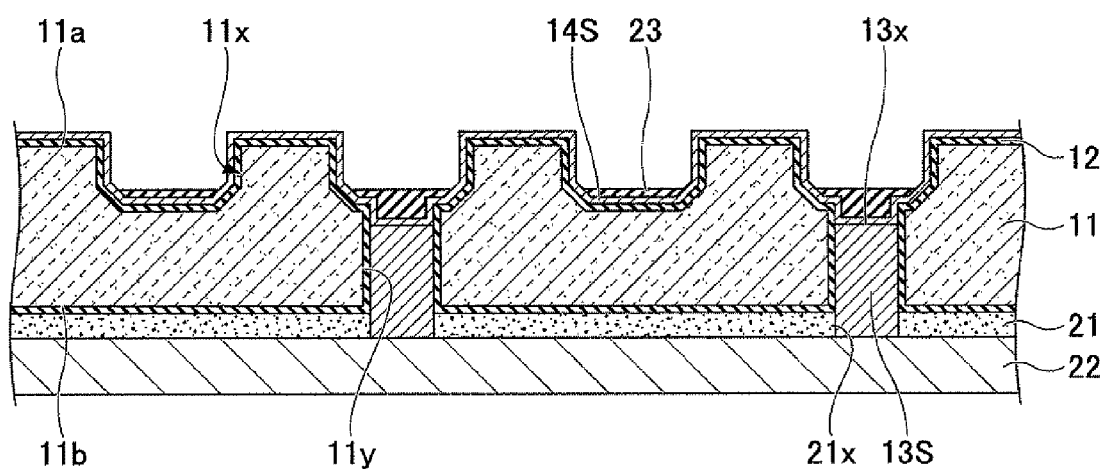

Then, in the process illustrated in FIG. 17, by developing the exposed resist layer 23S, the resist layer 23S formed on the first surface 11a of the substrate body, the inner side surface 11q of the trench 11x, and a part of the slope surface 11r of the trench 11x is removed. By removing the resist layer 23S formed on the first surface 11a of the substrate body, the inner side surface 11q of the trench 11x, and a part of the slope surface 11r of the trench 11x, the resist layer 23 is formed on the inner bottom surface 11p of the trench 11x and a part of the slope surface except for an outer rim part of the slope surface 11r (toward the inner side surface 11q). That is, the resist layer 23 is not formed on an outer rim part of the first insulating layer 12 covering the slope surface 11r of the trench 11x. Thus, the first insulating layer 12 is exposed at the outer rim part of the slope surface 11r. The exposed first insulating layer 12 has a belt-like shape having a substantially constant width of approximately a few μm.

Figure 18:
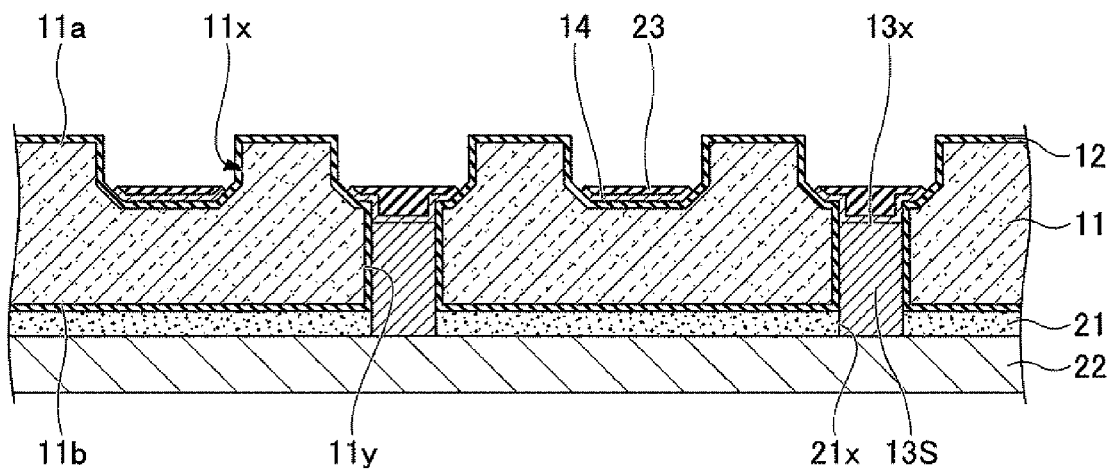

Then, in the process illustrated in FIG. 18, etching is performed on the second conductive layer 14S (illustrated in FIG. 17) by using the resist layer 23 as a mask. Thereby, the second conductive layer 14 covered by the resist layer 23 is formed whereas a part(s) of the second conductive layer 14S not covered by the resist layer 23 is removed. Then, in the process illustrated in FIG. 19, the resist layer 23 is removed.

Figure 20:
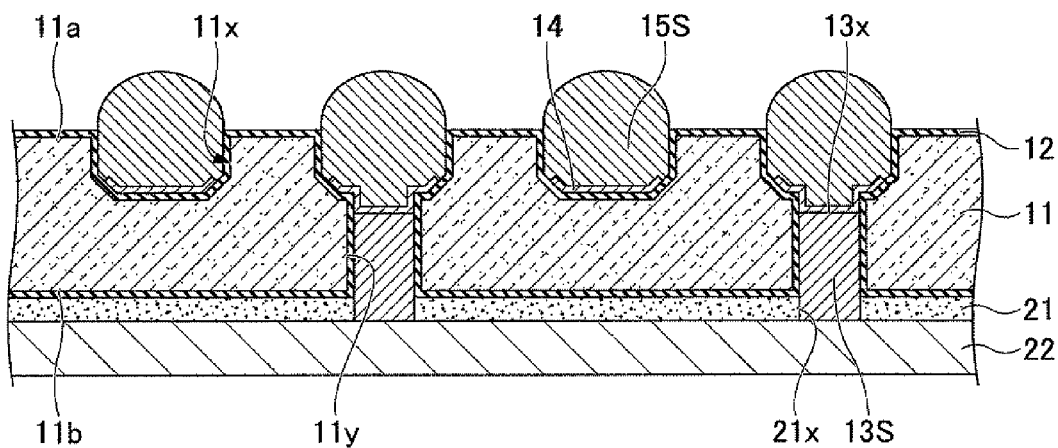

Then, in the process illustrated in FIG. 20, a plating film is deposited (grown) inside the trench 11x from the side of the second conductive layer 14 by performing an electroplating method using the metal layer 22, the first conductive layer 13S, and the second conductive layer 14 as a power feed layer (power supply layer). Thereby, a third conductive layer 15S is formed. For example, copper (Cu) may be used as the material of the third conductive layer 15S. The third conductive layer 15S is formed projecting from the top surface of the first insulating layer 12 covering the first surface 11a of the substrate body 11. The amount by which the third conductive layer 15S projects from the top surface of the first insulating layer 12 is, for example, approximately 30 μm to 40 μm.

Figure 21:
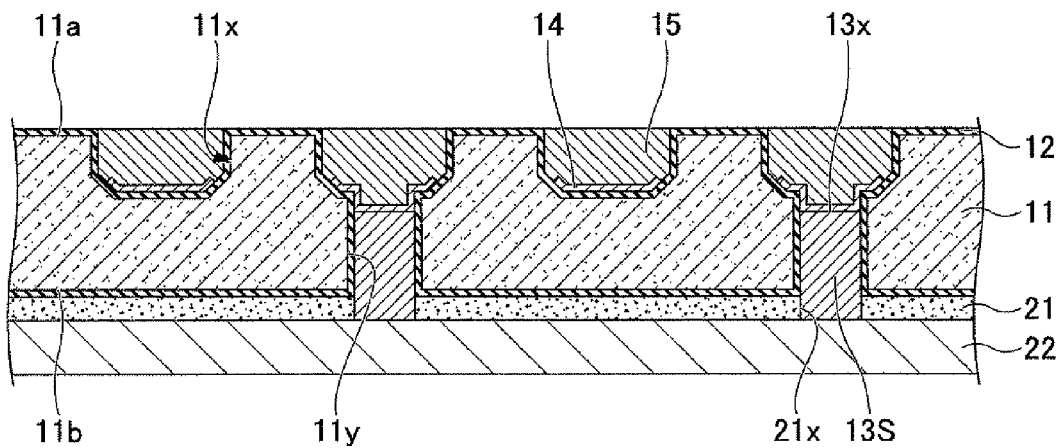

Then, in the process illustrated in FIG. 21, the third conductive layer 15S projecting from the first surface side of the substrate body 11 (see, for example, FIG. 20) is polished by, for example, a chemical mechanical polishing (CMP) method. Thereby, the third conductive layer 15 is formed. The top surface of the third conductive layer 15 is substantially flush with the top surface of the first insulating layer 12 covering the first surface 11a of the substrate body 11. By the process illustrated in FIG. 21, a wiring pattern including the third conductive layer 15 is formed.

Figure 22:
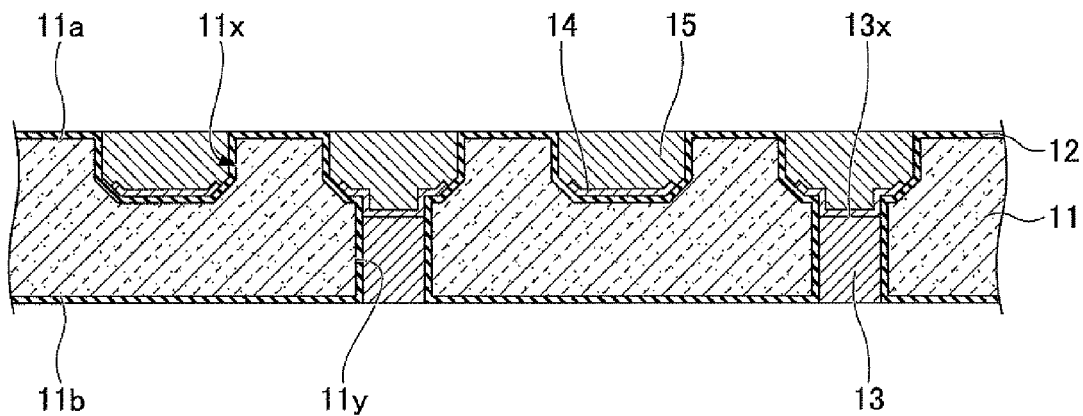

Then, in the process illustrated in FIG. 22, the adhesive layer 21 and the metal layer 22 illustrated in FIG. 21 are removed. Then, by further polishing the first conductive layer 13S projecting from the second surface side of the substrate body 11 (see, for example, FIG. 21), the first conductive layer 13 is formed. The metal layer (in this embodiment, a copper (Cu) plate) 22 may be removed by, for example, a wet-etching method using a solution such as a ferric chloride solution, a cupric chloride solution, or an ammonium persulfate solution. However, in a case where the third conductive layer 15 is formed of copper (Cu), an exposed surface of the third conductive layer 15 is to be masked for preventing the exposed surface of the third conductive layer 15 from being etched together with the metal layer 22. The adhesive layer 21 may be removed by, for example, an ashing method. The first conductive layer 13S may be polished by, for example, a chemical mechanical polishing (CMP) method. A bottom surface of the first conductive layer 13 (surface from the top surface of the first conductive layer 13 toward the trench 11x) is substantially flush with a bottom surface of the first insulating layer 12 covering the second surface 11b of the substrate body 11.

Then, in a process (not illustrated) subsequent to the process illustrated in FIG. 22, the second insulating layer 16 including the opening part 16x, the third insulating layer 17 including the opening part 17x, the first external connection terminal 18, and the second external connection terminal 19 are formed by using a known method(s). Thereby, the manufacturing of the wiring substrate (illustrated in FIGS. 5-7) is completed.

Figure 23:
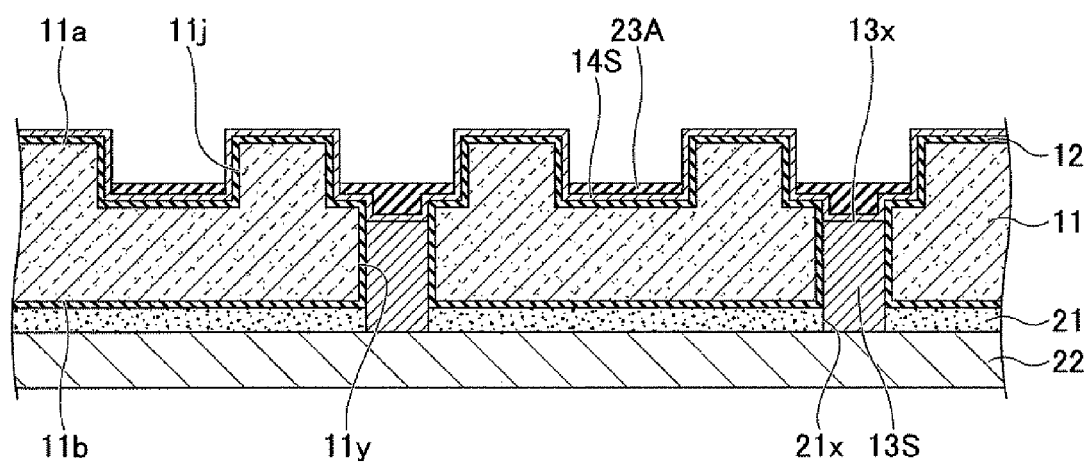
FIGS. 23 and 24 are schematic diagrams illustrating processes of a method for manufacturing a wiring substrate according to a first comparative example.
Figure 24:
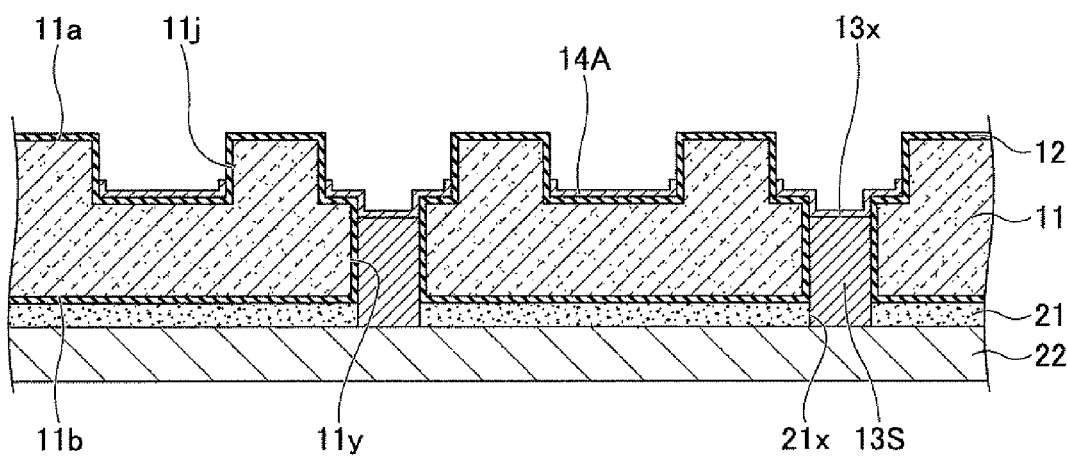

Next, a unique effect attained by the wiring substrate 10 of the above-described embodiment is described with reference to comparative examples. FIGS. 23 and 24 are schematic diagrams illustrating processes of a method for manufacturing a wiring substrate of a first comparative example. First, the same processes performed in FIGS. 9-17 of the above-described embodiment are performed in FIG. 23. That is, because the process of forming a slope surface 11r illustrated in FIG. 8 is not performed, a trench 11j of the first comparative example has a rectangular cross-section and has its inner bottom surface and a bottom end part of its inner side surface (end toward the inner bottom surface) covered by a resist layer 23A.

Figure 19:
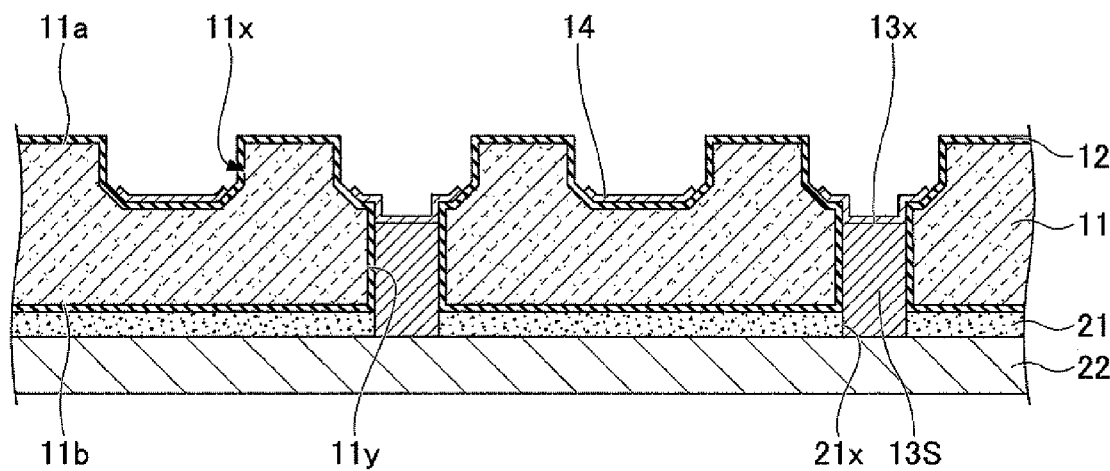

Then, the same processes illustrated in FIGS. 18 and 19 of the above-described embodiment are performed in FIG. 24. Thereby, a second conductive layer 14A is formed. The second conductive layer 14A is formed inside the recess part 13x and a portion inside the trench 11j. More specifically, the second conductive layer 14A covers a top surface of the first conductive layer 13 (surface of the first conductive layer 13 toward the trench 11j) and is formed entirely on the first insulating layer 12 covering the inner bottom surface of the trench 11j and on the bottom end part of the first insulating layer 12 (toward the inner bottom surface of the trench 11j) covering the inner side surface of the trench 11j. It is to be noted that the material and the thickness of the second conductive layer 14A are the same as those of the second conductive layer 14.

Thus, in a case where the process of forming the slope surface 11r illustrated in FIG. 8 is not performed, the second conductive layer 14A is formed on the bottom end part of the first insulating layer 12 (toward the inner bottom surface of the trench 11j). As a result, in a case of filling the recess part 13x and the trench 11j by depositing (growing) a plating film inside the trench 11j from the side of the second conductive layer 14A by performing an electroplating method using the metal layer 22, the first conductive layer 13S, and the second conductive layer 14A as a power feed layer (power supply layer), the plating film grows from two directions (one from the inner bottom surface of the trench 11j and the other from the bottom end part of the inner side surface of the trench 11j). This leads to, for example, seams or voids generated at a bonding part between the plating films grown from two directions.

In the process of the first comparative example 1 corresponding to the process illustrated in FIG. 15, the resist layer 23A tends to accumulate at a corner part of the trench 11j having a rectangular cross section. As a result, the resist layer 23A formed at the corner part tends to be thicker compared to the resist layer 23A formed at other parts. Accordingly, even where the resist layer 23A formed in the corner part is subjected to exposure and development, the resist layer 23A might not be completely removed. Nevertheless, it is extremely difficult to prevent the bottom end part (toward the inner bottom surface of the trench 11j) of the inner side surface of the trench 11j from being covered by the resist layer 23A.

In contrast, with the method for manufacturing the wiring substrate 10 according to the above-described embodiment, although the second conductive layer 14 is formed on a part of the first insulating layer 12 covering the slope surface 11r, the first insulating layer 12 covering the inner side surface 11p can be prevented from having the second conductive layer 14 formed thereon owing to the process of forming the slope surface 11r of FIG. 8.

As a result, in a case of filling the inside of the recess part 13x and the trench 11x with the third conductive layer 13 by depositing (growing) a plating film inside the trench 11x from the side of the second conductive layer 14 by performing an electroplating method using the metal layer 22, the first conductive layer 13S, and the second conductive layer 14 as a power feed layer (power supply layer), the plating film does not grow from the inner side surface 11q. Accordingly, the generation of defects such as seams and voids can be prevented. As a result, the third conductive layer 15S can be prevented from being disconnected by thermal pressure due to the generation of, for example, seams or voids. Further, the third conductive layer 15S can prevent reduction of connection reliability with respect to the first external connection terminal 18.

It is to be noted that the second conductive layer 14 is also formed on a part of the slope surface 11r (toward the inner bottom surface 11p) and a plating film grows from this part of the slope surface 11r. However, because the slope surface 11r is inclined, for example, approximately 45 degrees to 55 degrees with respect to the inner bottom surface 11p, the probability of the generation of seams and voids can be significantly reduced compared to forming the second conductive layer 14 on the inner side surface 11q that is substantially orthogonal to the inner bottom surface 11p.

Figure 25:
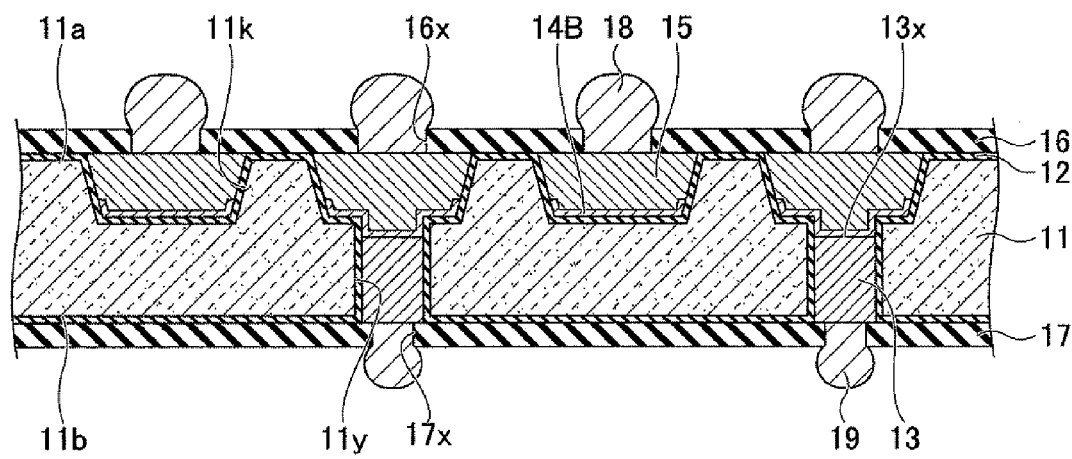
FIG. 25 is a cross-sectional view of a wiring substrate according to a second comparative example.

FIG. 25 is a cross-sectional view of a wiring substrate 10A according to a second comparative example. With reference to the wiring substrate 10A illustrated in FIG. 25, the cross section of a trench 11k including an opening part on the first surface side of the substrate body 11 has a tapered shape. In other words, the width of the opening part of the trench 11k is greater than the width of the inner bottom surface of the trench 11k. When the second conductive layer 14B is formed on a part of the slope surface as illustrated in FIG. 25 where the trench 11k is formed having a tapered cross section, a plating film grows from the part of the slope surface. In this case also, the probability of the generation of seams and voids can be reduced compared to forming the second conductive layer 14 on the inner side surface 11q that is substantially orthogonal to the inner bottom surface 11p.

However, by forming a trench having a tapered cross section as the trench 11k, it becomes difficult to arrange the trenches 11k with a narrow pitch. That is, it becomes difficult to narrow the pitch of a wiring pattern. On the other hand, with the wiring substrate 10 of the above-described embodiment, the trenches 11x can be arranged with a narrow pitch because the slope surface 11r is only formed on a bottom end part of the inner side surface 11q (toward the inner bottom surface 11p). In other words, the forming of the slope 11r does not prevent the narrowing of the pitch of a wiring pattern.

Accordingly, with the above-described embodiment of the present invention, the metal layer 22 is provided on the second surface 11b of the substrate body 11 via the adhesive layer 21. By performing an electroplating method using the metal layer 22 as the power feed layer, a plating film is grown from a single direction in the penetration hole 11y having its inner side surface covered by the first insulating layer 12. Thereby, the first conductive layer 13 is formed. As a result, defects such as seams and voids can be prevented from being generated in the first conductive layer 13. The first conductive layer 13 can be prevented from being disconnected by thermal pressure due to the generation of, for example, seams or voids. Further, the first conductive layer 13 can prevent reduction of connection reliability with respect to the second external connection terminal 19.

Moreover, the second conductive layer 14 is formed. The second conductive layer 14 covers the first insulating layer 12 covering the top surface of the first conductive layer 13 (surface of the first conductive layer 13 toward the trench 11x) and the inner side surface of the penetration hole 11y. Further, the second conductive layer 14 is formed on the first insulating layer 12 covering the inner bottom surface 11p of the trench 11x and a part of the first insulating layer 12 covering the slope surface 11r of the trench 11x (a part of the slope surface 11r except for a part toward the inner side surface 11q). By performing an electroplating method using the metal layer 22, the first conductive layer 13, and the second conductive layer 14 as the power feed layer, a plating film is grown from substantially a single direction in the recess part 13x and the trench 11x. Thereby, the third conductive layer 15 is formed. As a result, defects such as seams and voids can be prevented from being generated in the third conductive layer 15. The third conductive layer 15 can be prevented from being disconnected by thermal pressure due to the generation of, for example, seams or voids. Further, the third conductive layer 15 can prevent reduction of connection reliability with respect to the first external connection terminal 18.

Moreover, compared to a trench having a substantially rectangular cross section, the trench 11x including the slope surface 11r can relieve the pressure applied to the vicinity of the trench 11x of the substrate body 11.

Because the wiring substrate 10 according to the above-described embodiment of the present invention is manufactured by the processes illustrated in FIGS. 8-22, the wiring substrate 10 has a configuration in which the second conductive layer 14 is interposed between the first conductive layer 13 and the third conductive layer 15 (see, for example, FIG. 6).

FIRST MODIFIED EXAMPLE

Next, a wiring substrate 10B according to a first modified example of the above-described embodiment of the present invention is described. The difference between the above-described embodiment and the first modified example is the position in which the second conductive layer 14 is formed. In the first modified example, like components/parts are denoted by like reference numerals as those of the above-described embodiment and are not further explained.

Figure 26:
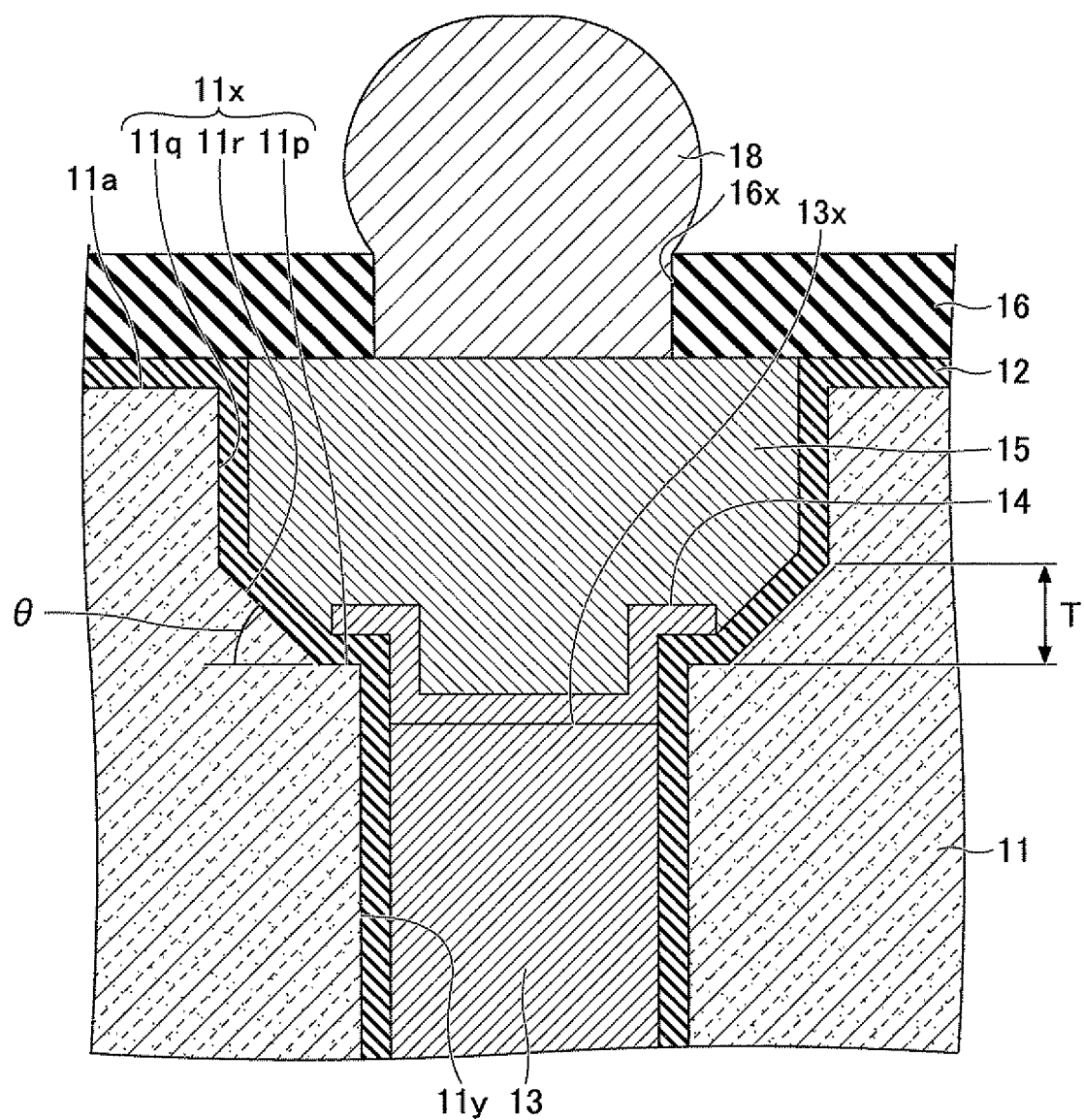
FIGS. 26 and 27 are enlarged partial views illustrating the vicinity of a trench of a wiring substrate according to a first modified example.
Figure 27:
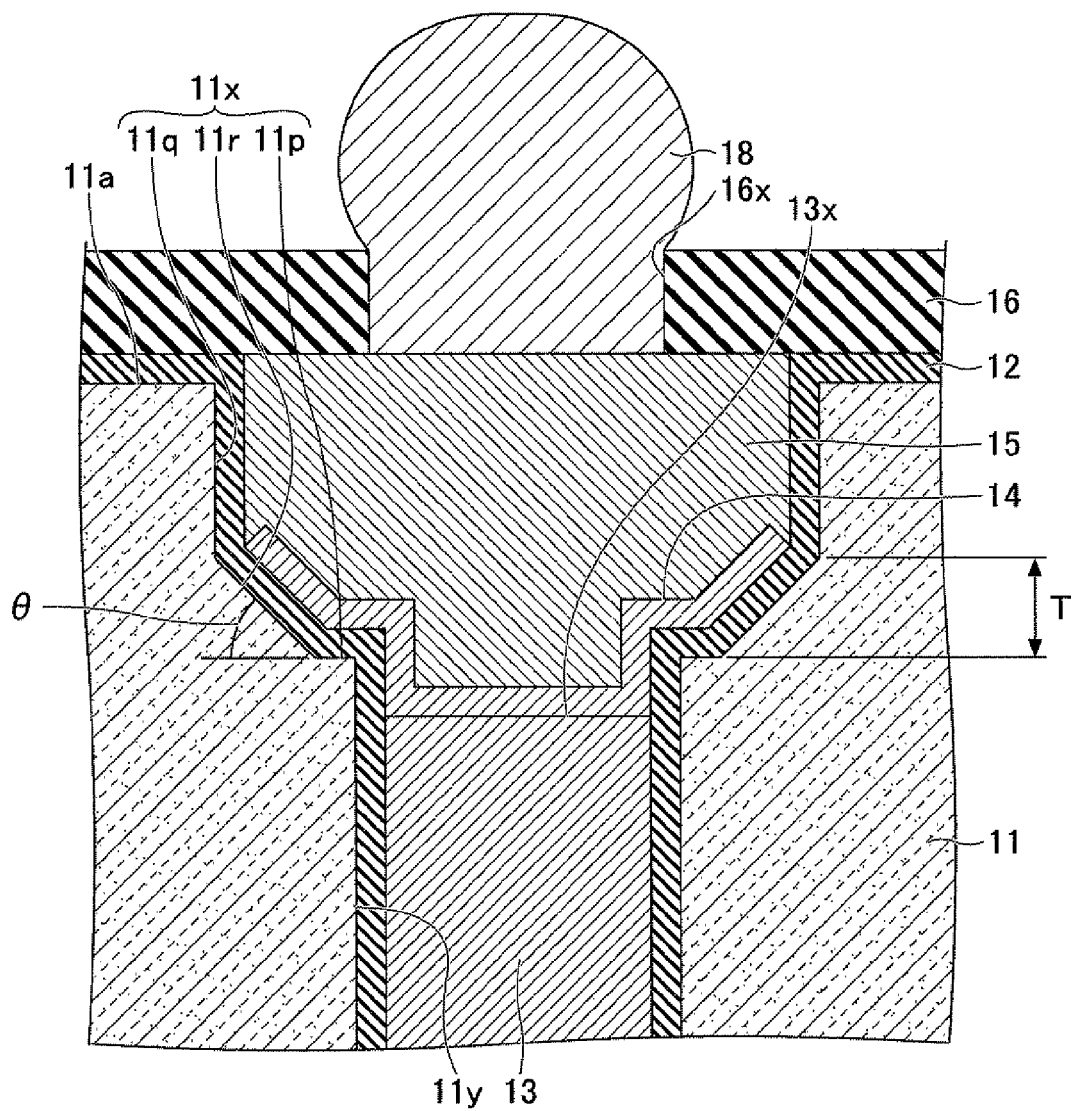

FIGS. 26 and 27 are enlarged diagrams illustrating the vicinity of the trench 11x of the wiring substrate 10B according to the first modified example of the above-described embodiment of the present invention.

As illustrated in FIG. 26, the second conductive layer 14 covers the top surface of the first conductive layer 13 (toward the trench 11x) and the entire first insulating layer 12 covering the inner bottom surface 11p of the trench 11x. In other words, in the first modified example, the second conductive layer 14 does not necessarily have to be formed on the first insulating layer 12 covering the slope surface 11r. Alternatively, the second conductive layer 14 may be formed covering the top surface of the first conductive layer 13 toward the trench 11x and a large part of the first insulating layer 12 covering the inner bottom surface 11p of the trench 11x (e.g., part except for an outer rim part of the first insulating layer 12). This is because, even if the second conductive layer 14 is not formed entirely on the first insulating layer 12 covering the inner bottom surface 11p of the trench 11x, the third conductive layer 15 can be formed by an electroplating method using, for example, the second conductive layer 14 as the power feed layer as long as the second conductive layer 14 is formed on a part of the first insulating layer 12 covering the inner bottom surface 11p.

Alternatively, as illustrated in FIG. 27, the second conductive layer 14 may be formed covering the top surface of the first conductive layer 13 toward the trench 11x, an entire part of the first insulating layer 12 covering the inner bottom surface 11p of the trench 11x, and an entire part of the first insulating layer 12 covering the slope surface 11r. Even in this case, no plating film grows from the inner side surface 11q when forming the third conductive layer 15 by an electroplating method using, for example, the second conductive layer 14 as the power feed layer. Accordingly, defects such as seams and voids can be prevented from being generated in the third conductive layer 15.

Accordingly, as long as the second conductive layer 14 is formed on a part of the first insulating layer 12 except for a part of the first insulating layer 12 covering the inner side surface 11q of the trench 11x, generation of defects such as seams and voids can be prevented when forming the third conductive layer 15 by an electroplating method using, for example, the second conductive layer 14 as the power feed layer.

SECOND MODIFIED EXAMPLE

Next, a wiring substrate 10C according to a second modified example of the above-described embodiment of the present invention is described. The difference between the above-described embodiment and the second modified example is the configuration in which the wiring substrate is delivered (shipped). In the second modified example, like components/parts are denoted by like reference numerals as those of the above-described embodiment and are not further explained.

Figure 28:
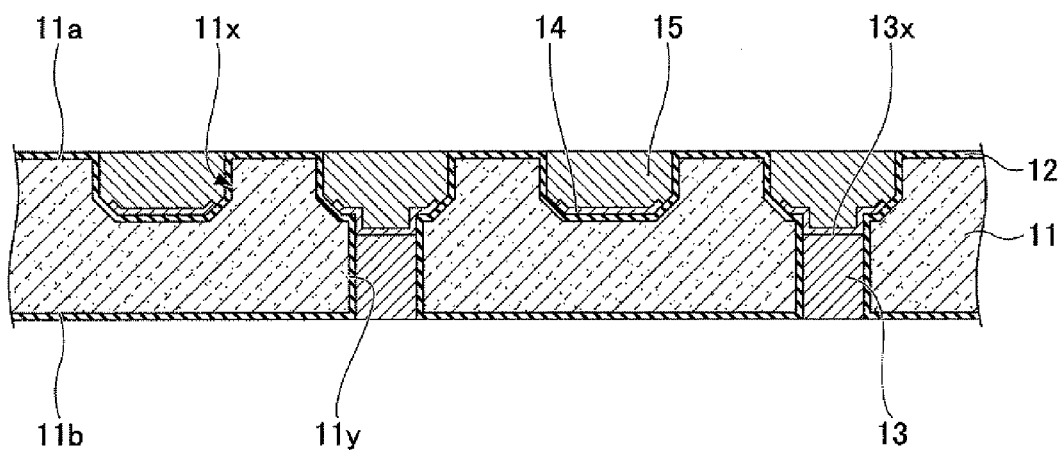
FIG. 28 is a cross-sectional view illustrating a wiring substrate according to a second modified example.

Although the wiring substrate 10 illustrated in, for example, FIG. 6 includes the second and third insulating layers 16, 17, the second and third insulating layers 16, 17 may be omitted as in the configuration of the wiring substrate 10C illustrated in FIG. 28 in view of the second and the third insulating layers 16, 17 being used as solder resist layers.

Moreover, although the wiring substrate 10 illustrated in, for example, FIG. 6 includes the first and the second external connection terminals 18, 19, they may be omitted as in the configuration of the wiring substrate 10C illustrated in FIG. 28 in view of the first and the second external connection terminals 18, 19 being used as terminals for electrically connecting the wiring substrate 10 to, for example, a semiconductor chip or another wiring substrate. In the wiring substrate 10C according to the second modified example, the third conductive layer 15 exposed on the first surface 11a of the substrate body 11 or the first conductive layer 13 exposed on the second surface 11b of the substrate body 11 are used as external connection terminals.

In a case of connecting the wiring substrate 10C to, for example, a semiconductor chip or another wiring substrate, the third conductive layer 15 exposed on the first surface 11a of the substrate body 11 or the first conductive layer 13 exposed on the second surface 11b of the substrate body 11 is connected to the semiconductor chip or to a bump or a pin provided on the other wiring substrate.

Accordingly, the configuration of shipping the wiring substrate is not limited to the embodiment illustrated in, for example, FIG. 6. For example, the configuration illustrated in, for example, FIG. 28 may be used. Alternatively, a configuration of a wiring substrate having only the second and the third insulating layers 16, 17 may be used (i.e. omitting the first and the second external connection terminals 18, 19).

Alternatively, a configuration having an insulating layer or an external connection terminal formed on only one of the first and the second surfaces of the substrate body 11 may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, the process of forming the penetration hole 11y in the wiring substrate 10 may be performed before the process of forming the trench 11x.

The invention claimed is:

1. A wiring substrate comprising:
a substrate body including first and second surfaces;
a trench having an opening part formed on the first surface and including an inner bottom surface, an inner side surface, and a slope surface that connects a peripheral part of the inner bottom surface to a one end part of the inner side surface, and widens from the peripheral part of the inner bottom surface to the one end part of the inner side surface, the one end part of the inner side surface being an end part that is opposite from the first surface of the substrate body;
a penetration hole including a first end that communicates with the inner bottom surface and a second end that is open on the second surface;
a first conductive layer filling at least a portion of the penetration hole and including a top surface toward the trench;
a second conductive layer covering the top surface of the first conductive layer and formed on at least a portion of the trench except for a part of the inner side surface; and
a third conductive layer covering the second conductive layer and filling the trench.

2. The wiring substrate as claimed in claim 1, wherein the second conductive layer is formed entirely on the inner bottom surface and at least a portion of the slope surface.

3. The wiring substrate as claimed in claim 1, wherein the top surface of the first conductive layer is in a position in which the top surface of the first conductive layer is recessed toward the second surface of the substrate body with respect to the inner bottom surface.

4. The wiring substrate as claimed in claim 1,
wherein the first conductive layer includes a bottom surface that is opposite from the top surface and exposed at the second end of the penetration hole,
wherein the bottom surface is substantially flush with the second surface of the substrate body.

5. The wiring substrate as claimed in claim 1,
wherein the third conductive layer includes a top surface that is exposed at the opening part of the trench,
wherein the top surface of the third conductive layer is substantially flush with the first surface of the substrate body.

6. A method for manufacturing a wiring substrate, the method comprising:
forming a trench in a substrate body including first and second surfaces, the trench having an opening part formed on the first surface and including an inner bottom surface, an inner side surface, and a slope surface that connects a peripheral part of the inner bottom surface to a one end part of the inner side surface, and widens from the peripheral part of the inner bottom surface to the one end part of the inner side surface, the one end part of the inner side surface being an end part that is opposite from the first surface of the substrate body;
forming a penetration hole including a first end that communicates with the inner bottom surface and a second end that is open on the second surface;
forming a metal layer on the second surface;
forming a first conductive layer that fills at least a portion of the penetration hole from the second end by performing a first electroplating method;
forming a second conductive layer on a top surface of the first conductive layer and at least a portion of the trench except for a part of the inner side surface;
forming a third conductive layer that covers the second conductive layer and fills the trench by performing a second electroplating method; and
removing the metal layer.

7. The method as claimed in claim 6,
wherein the metal layer is used as a power feed layer in the first electroplating method,
wherein the metal layer, the first conductive layer, and the second conductive layer are used as a power feed layer in the second electroplating method.

8. The method as claimed in claim 6, wherein the forming of the second conductive layer includes forming the second conductive layer entirely on the inner bottom surface and at least a portion of the slope surface.

9. The method as claimed in claim 6, wherein the forming of the first conductive layer includes forming the top surface of the first conductive layer in a position in which the top surface of the first conductive layer is recessed toward the second surface of the substrate body with respect to the inner bottom surface.

10. The method as claimed in claim 6, wherein the forming of the trench includes forming the slope surface by performing an anisotropic etching method using an alkaline solution.

11. The method as claimed in claim 6,
wherein the substrate body includes silicon,
wherein the first surface of the substrate body includes a silicon plane,
wherein the forming of the trench includes etching the silicon plane.

* * * * *

UNITED STATES PATENT AND TRADEMARK OFFICE
CERTIFICATE OF CORRECTION

| | |
|---|---|
| PATENT NO. | : 8,729,407 B2 |
| APPLICATION NO. | : 13/480985 |
| DATED | : May 20, 2014 |
| INVENTOR(S) | : Mori |

It is certified that error appears in the above-identified patent and that said Letters Patent is hereby corrected as shown below:

On the title page item [73], correct Assignee's name to "SHINKO ELECTRIC INDUSTRIES CO., LTD." from "Shinko ELectric Industries Co., Ltd."

Signed and Sealed this
Sixth Day of January, 2015

Michelle K. Lee
*Deputy Director of the United States Patent and Trademark Office*